US011398461B2

(12) United States Patent
Shin et al.

(10) Patent No.: US 11,398,461 B2
(45) Date of Patent: Jul. 26, 2022

(54) ELECTRONIC DEVICE

(71) Applicant: LG ELECTRONICS INC., Seoul (KR)

(72) Inventors: Seung Yong Shin, Seoul (KR); Sungchul Shin, Yongin-si (KR); Dong Young Lee, Incheon (KR); Chang Kyu Hwang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 195 days.

(21) Appl. No.: 16/723,596

(22) Filed: Dec. 20, 2019

(65) Prior Publication Data

US 2020/0203324 A1 Jun. 25, 2020

(30) Foreign Application Priority Data

Sep. 23, 2019 (KR) ........................ 10-2019-0116964

(51) Int. Cl.
*H01L 25/075* (2006.01)
*G02B 5/08* (2006.01)
(Continued)

(52) U.S. Cl.
CPC ............ *H01L 25/0756* (2013.01); *G02B 5/08* (2013.01); *G02B 27/0172* (2013.01);
(Continued)

(58) Field of Classification Search
CPC ............ H01L 25/0756; H01L 25/0753; G02B 27/0172; G02B 27/4205; G02B 2027/0112; G02B 27/0101; G02B 27/0081
See application file for complete search history.

(56) References Cited

U.S. PATENT DOCUMENTS

2017/0090194 A1 3/2017 Hayes
2019/0086669 A1* 3/2019 Percival ................ H01L 27/156
2020/0271932 A1* 8/2020 Tuomisto .............. G06T 19/006

FOREIGN PATENT DOCUMENTS

JP     2017116885     6/2017
KR     101852680      4/2018
(Continued)

OTHER PUBLICATIONS

PCT International Application No. PCT/KR2019/012417, International Search Report dated Jun. 24, 2020, 2 pages.

*Primary Examiner* — Kimberly N. Kakalec
(74) *Attorney, Agent, or Firm* — Lee Hong Degerman Kang & Waimey

(57) ABSTRACT

An electronic device comprising: a first display panel having a first side facing an eye of a user; a second display panel having a first side disposed at a second side of the first display panel; a first optical element disposed at the first display panel to emit one of red (R), green (G), or blue (B) light; a second optical element disposed at the first display panel together with the first optical element and configured to emit another one of the R, G, or B light; and a third optical element disposed at the second display panel to emit the remaining one of the R, the G, and the B light. The electronic device according to the present disclosure may be associated with an artificial intelligence module, a robot, an augmented reality (AR) device, a virtual reality (VR) device, and a device related to 5G services and the like.

12 Claims, 23 Drawing Sheets

(51) Int. Cl.
*G02B 27/01* (2006.01)
*G02B 27/42* (2006.01)
*G06F 1/16* (2006.01)
*G02C 7/04* (2006.01)

(52) U.S. Cl.
CPC ......... *G02B 27/4205* (2013.01); *G06F 1/163* (2013.01); *H01L 25/0753* (2013.01); *G02B 2027/0112* (2013.01); *G02B 2027/0178* (2013.01); *G02C 7/04* (2013.01)

(56) References Cited

FOREIGN PATENT DOCUMENTS

| KR | 1020180036865 | 4/2018 |
| KR | 101995710 | 6/2019 |
| KR | 1020190072196 | 6/2019 |
| KR | 1020190101324 | 8/2019 |

* cited by examiner

ELECTRONIC DEVICE

CROSS-REFERENCE TO RELATED APPLICATION

Pursuant to 35 U.S.C. § 119(a), this application claims the benefit of earlier filing date and right of priority to Korean Patent Application No. 10-2019-0116964, filed on Sep. 23, 2019, the contents of which are all hereby incorporated by reference herein in its entirety.

BACKGROUND

1. Technical Field

The present disclosure relates to an electronic device and, more particularly, to an electronic device used for virtual reality (VR), augmented reality (AR), and mixed reality (MR).

2. Description of Related Art

Virtual reality (VR) refers to an artificial simulated environment or situation that is created using computer technology to be similar to, but not exactly the same as, the real world.

Augmented reality (AR) refers to technology that makes a virtual object or information interwoven with the real world, making the virtual object or information perceived as if existing in reality.

Mixed reality (MR) or hybrid reality refers to combining the real world with virtual objects or information, thereby generating a new environment or new information. In particular, mixed reality refers to the experience in which physical and virtual objects interact with each other in real time.

The virtual environment or situation stimulates the five senses of a user, allows the user to have a spatio-temporal experience similar to the one perceived from the real world, and thereby allows the user to freely cross the boundary between reality and imagination. In addition, the user may not only be immersed in such an environment, but may also interact with objects implemented in the environment by manipulating or giving a command to the objects through an actual device.

Recently, research into gear specialized for use in the above technical field is being actively conducted. Specifically, research into gear which allows the user to wear a glass-type electronic device to experience the above-described technology is being actively conducted.

However, a structure of the glass-type electronic device which transmits image light outputted from a specific part to the eyes of the user is relatively complicated, and thus the overall structure of the electronic device is also complicated.

As described above, when the structure of the electronic device is complicated, it may be difficult to manufacture gear with various shapes. Further, the weight and the volume are increased, which may be undesirable in terms of usability.

With regard to the above-described electronic device, Korean Patent Registration No. 10-1852680 (hereinafter, referred to as related art 1) discloses a head mount type display device and a method thereof which implement augmented reality or mixed reality.

Specifically, an image receiving unit which receives an actual image, a reflection mirror unit which reflects an image passing though the image receiving unit, and a display unit which totally reflects the image reflected from the mirror unit and outputs a virtual reality image are disclosed in related art 1.

However, since the display device of related art 1 needs to reflect the image to transmit the image to the eyes of the user, a separate component such as a reflection mirror unit for reflection is necessarily required, and thus the structure is relatively complicated.

Further, Korean Patent Registration No. 10-1995710 (hereinafter, referred to as related art 2) discloses a display device using a waveguide and an image display method therefor.

Specifically, disclosed in related art 2 are an image sending unit which emits image light including a plurality of colors for each pixel, a lens which refracts the image light to cause the image light to travel in a predetermined direction, a waveguide which totally reflects the image light passing through the lens to travel in a predetermined direction, and a holographic sheet which is adjacent to the waveguide and diffracts the image light to change a reflection angle.

However, in the display device of related art 2, a separate lens for allowing the image light to be incident on the waveguide needs to be installed, and thus the structure which transmits the image light to the eyes of the user is relatively complicated.

As described above, there is a need to simplify the structure of the electronic device used in the above technical field, while also allowing the electronic device to properly perform its function. However, the electronic devices in the related art have a limitation in that the above-described issues are not adequately addressed.

SUMMARY OF THE INVENTION

The present disclosure is directed to providing an electronic device used for virtual reality (VR), augmented reality (AR), and mixed reality (MR), in which an overall mechanical structure may be simplified by further simplifying transmission paths of image light while the electronic device is being used.

In addition, the present disclosure is further directed to providing an electronic device that is capable of ensuring stable images by overcoming a restriction on a resolution (PPI, pixels per inch) in a limited area for a display.

Further, the present disclosure is still further directed to providing an electronic device that, despite the use of optical elements emitting red (R) light, green (G) light, and blue (B) light, respectively, is capable of smoothly implementing various colors by combining the light with one another.

An electronic device according to an embodiment of the present disclosure is configured to transmit light emitted from optical elements to an eye of a user without using a separate optical engine. Specifically, the electronic device is configured such that optical elements capable of directly emitting the light are disposed at display panels so that image light emitted from the optical elements may be transmitted to an eye of the user through the display panels.

In addition, an electronic device according to an embodiment of the present disclosure is configured such that mono color optical elements, which are relatively advantageous in terms of the resolution (PPI), are disposed at the display panels. Specifically, the electronic device is configured such that first to third optical elements are configured to emit the red (R) light, the green (G) light, and the blue (B) light, respectively, are disposed to be dispersed on first and second display panels.

Further, an electronic device according to an embodiment of the present disclosure is configured such that the light emitted from the mono color optical elements is combined in a display unit. Specifically, the electronic device is configured such that the first display panel and the second display panel on which the first to third optical elements are dispersed to overlap each other so that the light emitted from the first to third optical elements may be combined with one another.

Furthermore, in the electronic device according to an embodiment of the present disclosure, a fourth optical element that is configured to emit white (W) light may be disposed at the second display panel.

Furthermore, in the electronic device according to an embodiment of the present disclosure, the first to fourth optical elements may include a micro LED.

Furthermore, in the electronic device according to an embodiment of the present disclosure, the first to fourth optical elements may include a transparent electrode.

Furthermore, in the electronic device according to an embodiment of the present disclosure, illumination paths of the light emitted from each of the first to fourth optical elements may overlap one another.

Furthermore, in the electronic device according to an embodiment of the present disclosure, the optical elements may be mounted at a first side of each display panel and configured to emit the light toward the eye of the user.

Furthermore, in the electronic device according to an embodiment of the present disclosure, the display panels may be adhered to one another through a first adhesive layer including an optical clear resin.

Furthermore, in the electronic device according to an embodiment of the present disclosure, the optical elements may be mounted on a second side of the first display panel and on the first side of the second display panel and configured to emit light toward the eye of the user.

Furthermore, in the electronic device according to an embodiment of the present disclosure, the optical elements may be mounted on both sides of the display panel and configured to emit light in both directions, and light emitted in a direction opposite to the eye of the user among the emitted light may be guided toward the eye of the user through a guide plate coupled to the second side of the display panel.

Furthermore, in the electronic device according to an embodiment of the present disclosure, the display panel and the guide plate may be adhered to each other through a second adhesive layer including the optical clear resin.

Furthermore, in the electronic device according to an embodiment of the present disclosure, the guide plate may be configured to reflect the light emitted in a direction opposite to the eye of the user to guide the light toward the eye of the user.

Furthermore, in the electronic device according to an embodiment of the present disclosure, the guide plate may be configured to diffract the light emitted in the direction opposite to the eye of the user to guide the light toward the eye of the user.

Furthermore, in the electronic device according to an embodiment of the present disclosure, the first to third optical elements emitting the red (R) light, the green (G) light, and the blue (B) light, respectively, may be disposed to be dispersed on the first to third display panels, respectively.

Furthermore, in the electronic device according to an embodiment of the present disclosure, the first to third display panels on which the first to third optical elements are disposed to overlap one another so that the light emitted from the first to third optical elements may be combined with one another.

Furthermore, in the electronic device according to an embodiment of the present disclosure, the fourth optical element configured to emit the white (W) light may be disposed at the fourth display panel, and such fourth display panel and the first to third display panels may be disposed to overlap one another.

An electronic device according to embodiments of the present disclosure may be configured such that the optical elements capable of directly emitting light are disposed at display panels so that image light emitted from the optical elements may be transmitted to the eyes of the user through the display panels, thereby further simplifying optical paths by transmitting the image light without using a separate optical engine.

In addition, according to at least one of the embodiments of the present disclosure, the first to third optical elements emitting the red (R) light, the green (G) light, and the blue (B) light, respectively, may be disposed to be dispersed at a first display panel and a second display panel, thereby ensuring stable images by overcoming the restriction on the resolution (PPI) in the limited area for the display.

Further, according to at least one of the embodiments of the present disclosure, the first display panel and the second display panel on which the first to third optical elements are disposed to overlap each other so that light emitted from the first to third optical elements may be combined with one another, thereby smoothly implementing the various colors despite the use of the mono color optical elements.

Furthermore, according to at least one of the embodiments of the present disclosure, a fourth optical element configured to emit white (W) light may be disposed at the second display panel, thereby implementing a large scale display by improving durability and efficiency.

Furthermore, according to at least one of the embodiments of the present disclosure, the first to fourth optical elements may include the micro LED, thereby implementing a higher resolution while simplifying an overall structure.

Furthermore, according to at least one of the embodiments of the present disclosure, the first to fourth optical elements may include the transparent electrode, thereby smoothly supplying power to implement a function of a display.

Furthermore, according to at least one of the embodiments of the present disclosure, illumination paths of light emitted from each of the first to fourth optical elements may overlap each other, thereby allowing light in the illumination paths of respective light to be effectively combined with one another.

Furthermore, according to at least one of the embodiments of the present disclosure, the optical elements may be mounted on the first sides of each of the display panels and configured to emit light toward the eyes of the user, thereby effectively implementing the function of the display in a structure in which the display panels are stacked.

Furthermore, according to at least one of the embodiments of the present disclosure, the display panels may be adhered to each other through the first adhesive layer including the optical clear resin, thereby ensuring light transmittance even when the display panels are stacked through the adhering.

Furthermore, according to at least one of the embodiments of the present disclosure, the optical elements may be mounted on the second side of the first display panel and on the first side of the second display panel and configured to emit light toward the eye of the user, thereby effectively implementing the function of the display in the structure in which the display panels are stacked.

Furthermore, according to at least one of the embodiments of the present disclosure, the optical elements may be mounted on both sides of the display panel and configured to emit light in both directions, and light emitted in a direction opposite to the eye of the user among the emitted light may be guided toward the eye of the user through the guide plate coupled to the second side of the display panel, thereby effectively implementing the function of the display in the structure in which the display panels are stacked.

Furthermore, according to at least one of the embodiments of the present disclosure, the display panel and the guide plate may be adhered to each other through the second adhesive layer including the optical clear resin, thereby ensuring light transmittance even when the display panel and the guide plate are stacked through the adhering.

Furthermore, according to at least one of the embodiments of the present disclosure, the guide plate may be configured to reflect light emitted in a direction opposite to the eye of the user to guide the light toward the eye of the user, thereby allowing the optical elements to be disposed at more various locations on the display panel.

Furthermore, according to at least one of the embodiments of the present disclosure, the guide plate may be configured to diffract the light emitted in the direction opposite to the eye of the user to guide the light toward the eye of the user, thereby allowing the optical elements to be disposed at the more various locations on the display panel.

Furthermore, according to at least one of the embodiments of the present disclosure, the first to third optical elements emitting the red (R) light, the green (G) light, and the blue (B) light, respectively, may be disposed to be dispersed on the first to third display panels, respectively, thereby ensuring stable images by overcoming the restriction on the resolution (PPI) in the limited area for the display.

Furthermore, according to at least one of the embodiments of the present disclosure, the first to third display panels on which the first to third optical elements are disposed to overlap one another so that the light emitted from the first to third optical elements may combined with one another, thereby smoothly implementing the various colors despite the use of the mono color optical elements.

Furthermore, according to at least one of the embodiments of the present disclosure, the fourth optical element configured to emit the white (W) light may be disposed at the fourth display panel, and such fourth display panel and the first to third display panels may be stacked to overlap one another, thereby implementing the large scale display by improving the durability and the efficiency.

DETAILED DESCRIPTION

Figure 1:
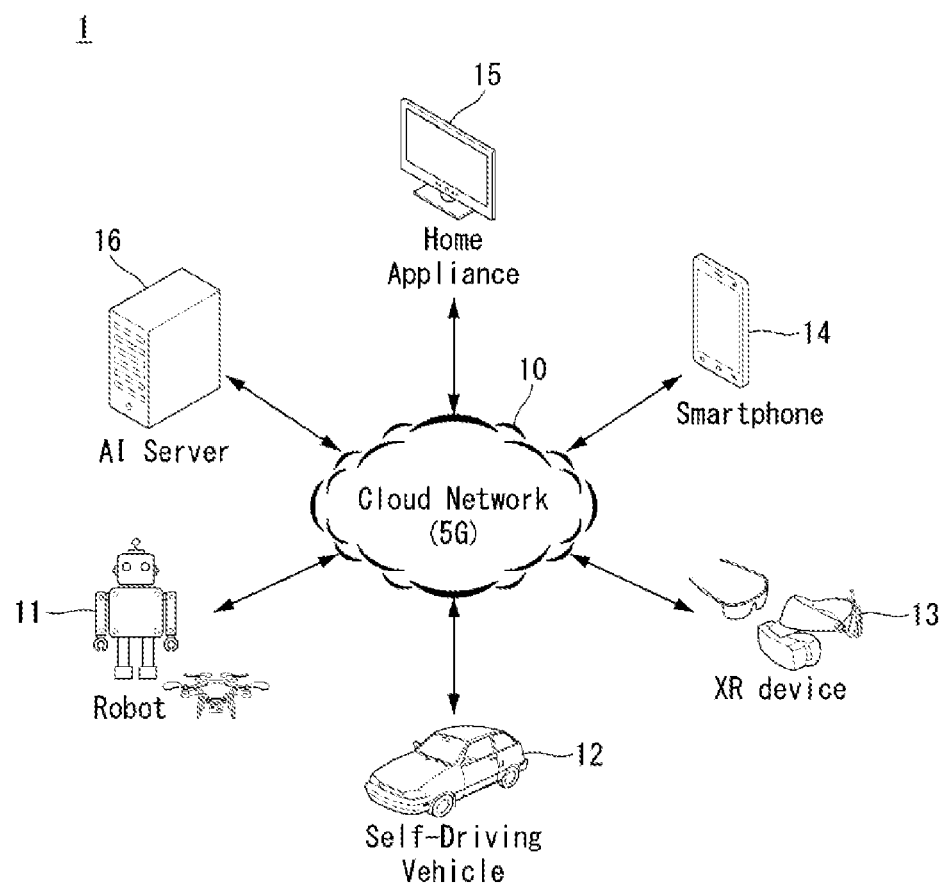
FIG. 1 is a conceptual view illustrating an embodiment of an artificial intelligence (AI) device.

In what follows, embodiments disclosed in this document will be described in detail with reference to appended drawings, where the same or similar constituent elements are given the same reference number irrespective of their drawing symbols, and repeated descriptions thereof will be omitted.

In describing an embodiment disclosed in the present specification, if a constituting element is said to be "connected" or "attached" to other constituting element, it should be understood that the former may be connected or attached directly to the other constituting element, but there may be a case in which another constituting element is present between the two constituting elements.

In addition, in describing an embodiment disclosed in the present document, if it is determined that a detailed description of a related art incorporated herein unnecessarily obscure the gist of the embodiment, the detailed description thereof will be omitted. Furthermore, it should be understood that the appended drawings are intended only to help understand embodiments disclosed in the present document and do not limit the technical principles and scope of the present disclosure; rather, it should be understood that the appended drawings include all of the modifications, equivalents or substitutes described by the technical principles and belonging to the technical scope of the present disclosure.

[5G Scenario]

The three main requirement areas in a 5G system are (1) an enhanced Mobile Broadband (eMBB) area, (2) a massive machine type communication (mMTC) area, and (3) an ultra-reliable and low latency communication (URLLC) area.

Some use cases may require a plurality of areas for optimization, but other use cases may focus on only one key performance indicator (KPI). The 5G system supports various use cases in a flexible and reliable manner.

eMBB far surpasses basic mobile Internet access, supports various interactive works, and covers media and entertainment applications in a cloud computing or augmented reality environment. Data is one of the core driving elements of the 5G system, and in the 5G era, for the first time, voice-only services may disappear. In 5G, voice is expected to be handled simply by an application program using a data connection provided by a communication system. Primary causes of increased volume of traffic are an increase of content size and an increase of the number of applications requiring a high data transfer rate. Streaming services (audio and video), interactive video, and mobile Internet connections will be more heavily used as more and more devices are connected to the Internet. These application programs require always-on connectivity to push real-time information and notifications to the user. Cloud-based storage and applications are growing rapidly in mobile communication platforms, which may be applied both to business and entertainment uses. Cloud-based storage is a special use case that is driving growth of uplink data transfer rate. 5G is also used for cloud-based remote work, and requires a much shorter end-to-end latency to ensure excellent user experience when a tactile interface is used. Entertainment, for example, cloud-based gaming and video streaming, is another core element that is causing an increase in demand for mobile broadband capability. Entertainment is essential for smartphones and tablets in any place including a high mobility environment, such as a train, car, and plane. Another use case is augmented reality for entertainment and information search. Here, augmented reality requires very low latency and instantaneous data transfer.

In addition, one among the most highly expected 5G use cases is a function that connects embedded sensors seamlessly in every possible area, namely a use case based on mMTC. Up to 2020, the number of potential IoT devices is expected to reach 20.4 billion. Industrial IoT is one of the key areas where 5G is performing a primary role in enabling infrastructure for smart cities, asset tracking, smart utilities, agriculture, and security.

URLLC includes new services which may transform industry through ultra-reliable/ultra-low latency links, such as remote control of major infrastructure and self-driving cars. The level of reliability and latency are essential for smart grid control, industry automation, robotics, and drone control and coordination.

Next, a plurality of use cases will be described in more detail.

5G may complement fiber-to-the-home (FTTH) and cable-based broadband (or DOCSIS) as a means to provide a stream estimated to occupy hundreds of megabits per second up to gigabits per second. This fast speed is required not only for virtual reality and augmented reality but also for transferring video with a resolution more than 4K (6K, 8K or more). VR and AR applications almost always include immersive sports games. Specific application programs may require a special network configuration. For example, in the case of a VR game, to minimize latency, game service providers may have to integrate a core server with an edge network service of the network operator.

Automobiles are expected to be a new important driving force for 5G systems together with various use cases of mobile communication for vehicles. For example, entertainment for passengers requires high capacity and high mobile broadband at the same time. This is so because users continue to expect a high-quality connection irrespective of their location and moving speed. Another use case in the automotive field is an augmented reality dashboard. An augmented reality dashboard identifies an object in darkness, and overlays information informing the driver of the distance to and motion of the object over what the driver is viewing through the front windshield. In the future, a wireless module will enable communication among vehicles, information exchange between a vehicle and supporting infrastructure, and information exchange among a vehicle and other connected devices (for example, devices carried by a pedestrian). A safety system guides alternative driving courses so that a driver may drive his or her vehicle more safely and to reduce the risk of accident. The next step will be a remotely driven or self-driven vehicle. This step requires highly reliable and highly fast communication between different self-driving vehicles and between a self-driving vehicle and infrastructure. In the future, it is expected that self-driving vehicles will perform all driving activities, while a human driver only focuses on abnormal driving situations that the self-driving vehicle is unable to recognize. Technical requirements for self-driving vehicles demand ultra-low latency and ultra-fast reliability so as to increase the level of traffic safety to a point that surpasses the level that can be reached by human drivers.

Smart cities and smart homes, referred to in relation to a smart society, will be embedded into high-density wireless sensor networks. Distributed networks comprising intelligent sensors may identify conditions for cost-effectively and energy-efficiently maintaining cities and homes. A similar configuration may be applied for each home. Temperature sensors, window and heating controllers, anti-theft alarm devices, and home appliances will all be connected wirelessly. Many of these sensors typically involve a low data transfer rate, low power, and low cost. However, for example, real-time HD video may require specific types of devices for the purpose of surveillance.

As consumption and distribution of energy including heat or gas is becoming highly distributed, automated control of a distributed sensor network is required. A smart grid collects information, and interconnects such sensors by using digital information and communication technologies such that the distributed sensor network operates according to the collected information. Since the information may include behaviors of energy suppliers and consumers, the smart grid may improve distribution of fuels such as electricity in terms of efficiency, reliability, economy, production sustainability, and automation. The smart grid may be regarded as a different type of sensor network with a low latency.

In the health-care sector, there are many application programs that may benefit from mobile communication. A communication system may support telemedicine, in which clinical care is provided remotely. Telemedicine may help reduce the barrier of distance, and improve access to medical services that are not readily available in remote rural areas. It may also be used to save lives in critical medical and emergency situations. A wireless sensor network based on mobile communication may provide remote monitoring and sensors for parameters such as heart rate and blood pressure.

Wireless and mobile communication is becoming increasingly important for industrial applications. Cable wiring involves high installation and maintenance costs. Therefore, replacement of cables with reconfigurable wireless links is an attractive opportunity for many industrial applications. However, to exploit the opportunity, wireless connection is required to function with a latency similar to that in cable connection, to be reliable and of large capacity, and to be easily managed. Low latency and very low error probability are new requirements that need to be linked to 5G.

Logistics and freight tracking, which require tracking of an inventory and packages at any place by using a location-based information system, are important use cases of mobile communication. The use case of logistics and freight tracking typically requires a low data rate but requires large-scale and reliable location information.

The present disclosure to be described below may be implemented by combining or modifying the respective embodiments to satisfy the aforementioned requirements regarding 5G.

FIG. 1 illustrates an embodiment of an AI device.

Referring to FIG. 1, in an AI system, at least one of an AI server 16, a robot 11, a self-driving vehicle 12, an XR device 13, a smartphone 14, or a home appliance 15 are connected to a cloud network 10. Here, the robot 11, the self-driving vehicle 12, the XR device 13, the smartphone 14, or the home appliance 15 to which AI technology is applied may be referred to as AI devices 11 to 15.

The cloud network 10 may configure part of the cloud computing infrastructure or refer to a network existing in the cloud computing infrastructure. Here, the cloud network 10 may be constructed by using a 3G network, a 4G or Long Term Evolution (LTE) network, or a 5G network.

In other words, the individual AI devices 11 to 16 constituting the AI system may be connected to each other through the cloud network 10. In particular, the individual AI devices 11 to 16 may communicate with each other through a base station, but may also communicate directly to each other without relying on a base station.

The AI server 16 may include a server performing AI processing and a server performing computations on big data.

The AI server 16 may be connected to at least one of the robot 11, the self-driving vehicle 12, the XR device 13, the smartphone 14, or the home appliance 15, which are the AI devices constituting the AI system, through the cloud network 10, and may assist with at least a part of the AI processing performed in the connected AI devices 11 to 15.

Here, the AI server 16 may train an artificial neural network according to a machine learning algorithm on behalf of the AI devices 11 to 15, directly store the trained model, or transmit the trained model to the AI devices 11 to 15.

Here, the AI server 16 may receive input data from the AI devices 11 to 15, infer a result value from the received input data by using the trained model, generate a response or control command based on the inferred result value, and transmit the generated response or control command to the AI devices 11 to 15.

Similarly, the AI devices 11 to 15 may infer a result value from the input data by employing the trained model directly, and generate a response or control command based on the inferred result value.

<AI+Robot>

By employing AI technology, the robot 11 may be implemented as a guide robot, a transport robot, a cleaning robot, a wearable robot, an entertainment robot, a pet robot, or an unmanned flying robot.

The robot 11 may include a robot control module for controlling its motion. The robot control module may correspond to a software module or a chip that implements the software module in the form of a hardware device.

Using sensor information obtained from various types of sensors, the robot 11 may obtain status information of the robot 11, detect (recognize) the surrounding environment and objects, generate map data, determine a movement path and drive plan, determine a response to a user interaction, or determine an operation.

Here, in order to determine a movement path and a drive plan, the robot 11 may use sensor information obtained from at least one sensor among light detection and ranging (LIDAR), radar, and a camera.

The robot 11 may perform the operations above by using a trained model configured by at least one artificial neural network. For example, the robot 11 may recognize the surrounding environment and objects by using the trained model, and determine its operation by using the recognized surrounding environment information or object information. Here, the trained model may be trained by the robot 11 itself or trained by an external device such as the AI server 16.

At this time, the robot 11 may perform the operation by generating a result by employing the trained model directly, but may also perform the operation by transmitting sensor information to an external device such as the AI server 16 and receiving a result generated accordingly.

The robot 11 may determine a movement path and a drive plan by using at least one of object information detected from the map data and sensor information or object information obtained from an external device, and drive according to the determined movement path and drive plan by controlling its locomotion platform.

The map data may include object identification information about various objects disposed in the space in which the robot 11 drives. For example, the map data may include object identification information about static objects such as walls and doors and movable objects such as flowerpots and desks. In addition, the object identification information may include a name, a type, a distance to, and a location of the objects.

In addition, the robot 11 may perform the operation or drive by controlling its locomotion platform based on the control/interaction of the user. At this time, the robot 11 may obtain intention information of the interaction according to the user's motion or spoken utterance, and perform an operation by determining a response based on the obtained intention information.

<AI+Autonomous Driving>

By employing AI technology, the self-driving vehicle 12 may be implemented as a mobile robot, an unmanned ground vehicle, or an unmanned aerial vehicle.

The self-driving vehicle 12 may include an autonomous driving control module for controlling its autonomous driving function. The autonomous driving control module may be a software module or a chip that implements the software module in the form of a hardware device. The autonomous driving control module may be installed inside the self-driving vehicle 12 as a constituting element thereof, or may be installed outside the self-driving vehicle 12 as a separate hardware component.

The self-driving vehicle 12 may obtain status information of the self-driving vehicle 12, detect (recognize) the surrounding environment and objects, generate map data, determine a movement path and drive plan, or determine motion by using sensor information obtained from various types of sensors.

Like the robot 11, in order to determine a movement path and a drive plan, the self-driving vehicle 12 may use sensor information obtained from at least one sensor among lidar, radar, and a camera.

In particular, the self-driving vehicle 12 may recognize an environment and objects in an area in which the view is obscured or an area extending beyond a predetermined distance by receiving sensor information from external devices, or may receive recognized information directly from the external devices.

The self-driving vehicle 12 may perform the operations above by using a trained model configured by at least one artificial neural network. For example, the self-driving vehicle 12 may recognize the surrounding environment and objects by using the trained model, and determine its drive route by using the recognized surrounding environment information or object information. Here, the training model may be trained by the self-driving vehicle 12 itself or trained by an external device such as the AI server 16.

At this time, the self-driving vehicle 12 may perform the operation by generating a result by employing the training model directly, but may also perform the operation by transmitting sensor information to an external device such as the AI server 16 and receiving a result generated accordingly.

The self-driving vehicle 12 may determine a movement path and drive plan by using at least one of object information detected from the map data and sensor information or object information obtained from an external device, and drive according to the determined movement path and drive plan by controlling its driving platform.

The map data may include object identification information about various objects disposed in the space (for example, road) in which the self-driving vehicle 12 drives. For example, the map data may include object identification information of stationary objects such as streetlamps, rocks, and buildings, and moveable objects such as vehicles and pedestrians. The object identification information may include a name, a type, a street, and a location.

In addition, the self-driving vehicle 12 may perform the operation or drive by controlling its driving platform based on the control/interaction of the user. At this time, the self-driving vehicle 12 may obtain intention information of the interaction according to the user's motion or spoken utterance and perform an operation by determining a response based on the obtained intention information.

<AI+XR>

By employing AI technology, the XR device 13 may be implemented as a head-mounted display (HMD), head-up display (HUD) installed in the vehicle, a TV, a mobile phone, a smartphone, a computer, a wearable device, a home appliance, a digital signage, a vehicle, and a stationary or mobile robot.

The XR device 13 may obtain information about a surrounding space or physical objects by generating position and attribute data about 3D points by analyzing 3D point cloud or image data acquired from various sensors or external devices, render XR objects to be outputted, and output the XR objects. For example, the XR device 13 may output XR objects including additional information on recognized objects in correspondence with the recognized objects.

The XR device 13 may perform the operations above by using a trained model configured by at least one artificial neural network. For example, the XR device 13 may recognize physical objects from 3D point cloud or image data by using the trained model, and provide information corresponding to the recognized physical objects. Here, the trained model may be trained by the XR device 13 itself or trained by an external device such as the AI server 16.

At this time, the XR device 13 may perform the operation by generating a result by employing the trained model directly, but may also perform the operation by transmitting sensor information to an external device such as the AI server 16 and receiving a result generated accordingly.

<AI+Robot+Autonomous Driving>

By employing AI and autonomous driving technologies, the robot 11 may be implemented as a guide robot, a transport robot, a cleaning robot, a wearable robot, an entertainment robot, a pet robot, or an unmanned flying robot.

The robot 11 employing the AI and autonomous driving technologies may refer to a robot having an autonomous driving function itself, or a robot 11 interacting with the self-driving vehicle 12.

The robot 11 having the autonomous driving function may collectively refer to devices which move autonomously along a given path without control of the user and devices which move by autonomously determining their path.

The robot 11 and the self-driving vehicle 12 having the autonomous driving function may use a shared sensing method to determine one or more of a movement path or a drive plan. For example, the robot 11 and the self-driving vehicle 12 having the autonomous driving function may determine the one or more of the movement path or the drive plan by using information sensed through lidar, radar, and a camera.

The robot 11 interacting with the self-driving vehicle 12, which exists separately from the self-driving vehicle 12, may perform an operation in association with an autonomous driving function inside or outside the self-driving vehicle 12 or in association with the user in the self-driving vehicle 12.

At this time, the robot 11 interacting with the self-driving vehicle 12 may control or assist the autonomous driving function of the self-driving vehicle 12 by obtaining sensor information on behalf of the self-driving vehicle 12 and providing the sensed information to the self-driving vehicle 12, or by obtaining sensor information, generating surrounding environment information or object information, and providing the generated information to the self-driving vehicle 12.

In addition, the robot 11 interacting with the self-driving vehicle 12 may control the function of the self-driving vehicle 12 by monitoring the user in the self-driving vehicle 12 or through interaction with the user. For example, if it is determined that the driver is drowsy, the robot 11 may activate the autonomous driving function of the self-driving vehicle 12 or assist the control of the driving platform of the self-driving vehicle 12. Here, the function of the self-driving vehicle 12 controlled by the robot 11 may include not only the autonomous driving function, but also functions provided by a navigation system or an audio system installed in the self-driving vehicle 12.

Furthermore, the robot 11 interacting with the self-driving vehicle 12 may provide information to the self-driving vehicle 12 or assist functions of the self-driving vehicle 12 from the outside of the self-driving vehicle 12. For example, the robot 11 may provide traffic information including traffic sign information to the self-driving vehicle 12 like a smart traffic light, or may automatically connect an electric charger to the charging port by interacting with the self-driving vehicle 12 like an automatic electric charger of an electric vehicle.

<AI+Robot+XR>

By employing AI technology, the robot 11 may be implemented as a guide robot, a transport robot, a cleaning robot, a wearable robot, an entertainment robot, a pet robot, or an unmanned flying robot.

The robot 11 employing XR technology may refer to a robot which acts as a control/interaction target in an XR image. In this case, the robot 11 may be distinguished from the XR device 13, and may operate in conjunction with the XR device 13.

When the robot 11, which acts as a control/interaction target in the XR image, obtains sensor information from the sensors including a camera, the robot 11 or the XR device 13 may generate an XR image based on the sensor information, and the XR device 13 may output the generated XR image. The robot 11 may then operate based on a control signal received through the XR device 13 or based on interaction with the user.

For example, through an external device such as the XR device 13, the user may remotely check the XR image corresponding to the viewpoint of the associated robot 11, and through interaction may modify the drive path of the robot 11, control the operation or driving of the robot 11, or check information of surrounding objects.

<AI+Autonomous Driving+XR>

By employing AI and XR technologies, the self-driving vehicle 12 may be implemented as a mobile robot, an unmanned ground vehicle, or an unmanned aerial vehicle.

The self-driving vehicle 12 employing the XR technology may refer to a self-driving vehicle having a means for providing XR images or a self-driving vehicle which acts as a control/interaction target in the XR image. In particular, the self-driving vehicle 12 which acts as a control/interaction target in the XR image may be distinguished from the XR device 13, and may operate in conjunction with the XR device 13.

The self-driving vehicle 12 having a means for providing XR images may obtain sensor information from sensors including a camera, and output XR images generated based on the obtained sensor information. For example, by displaying an XR image through a HUD, the self-driving vehicle 12 may provide XR images corresponding to physical objects or image objects to the passenger.

At this time, if an XR object is outputted on the HUD, at least part of the XR object may be outputted so as to overlap with the physical object at which the gaze of the passenger is directed. Alternatively, if an XR object is outputted on a display installed inside the self-driving vehicle 12, at least part of the XR object may be outputted so as to overlap with an image object. For example, the self-driving vehicle 12 may output XR objects corresponding to objects such as roads, other vehicles, traffic lights, traffic signs, bicycles, pedestrians, and buildings.

When the self-driving vehicle 12, which acts as a control/interaction target in the XR image, obtains sensor information from the sensors including a camera, the self-driving vehicle 12 or the XR device 13 may generate an XR image based on the sensor information, and the XR device 13 may output the generated XR image. The self-driving vehicle 12 may then operate based on the control signal received through an external device such as the XR device 13 or based on the interaction with the user.

[Extended Reality Technology]

Extended reality (XR) collectively refers to virtual reality (VR), augmented reality (AR), and mixed reality (MR). VR technology provides real world objects or backgrounds only in the form of computer-generated (CG) images, AR technology provides virtual CG images overlaid on real object images, and MR technology employs computer graphics technology to mix and combine virtual objects with the real world.

MR technology is similar to AR technology in that both technologies involve physical objects being displayed together with virtual objects. However, while virtual objects supplement physical objects in AR, virtual and physical objects co-exist as equivalents in MR.

XR technology may be applied to a HMD, a head-up display (HUD), a mobile phone, a tablet personal computer (PC), a laptop computer, a desktop computer, a TV, digital signage, and the like. A device employing XR technology may be referred to as an XR device.

In what follows, an electronic device providing XR according to an embodiment of the present disclosure will be described.

Figure 2:
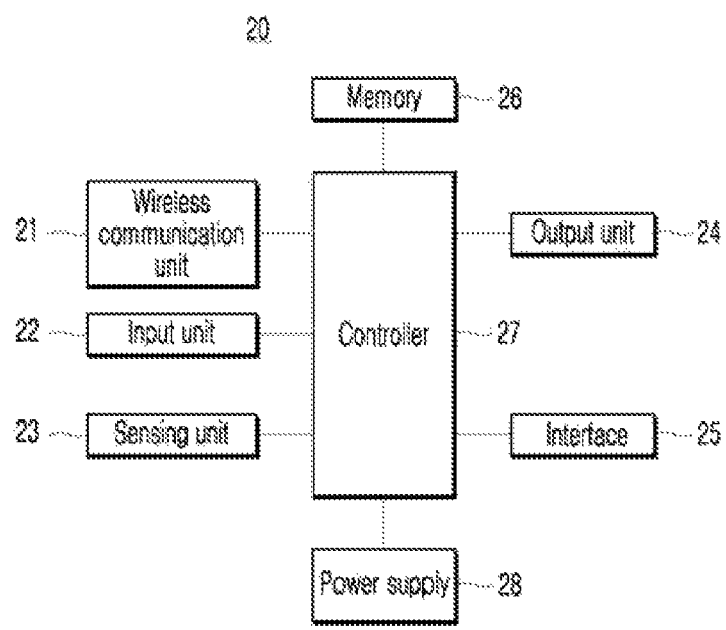
FIG. 2 is a block diagram illustrating the structure of an extended reality (XR) electronic device according to an embodiment of the present disclosure.

FIG. 2 is a block diagram illustrating the structure of an XR electronic device 20 according to an embodiment of the present disclosure.

Referring to FIG. 2, the XR electronic device 20 may include a wireless communication unit 21, an input unit 22, a sensing unit 23, an output unit 24, an interface 25, a memory 26, a controller 27, and a power supply 28. The constituting elements shown in FIG. 2 are not essential for implementing the XR electronic device 20, and therefore, the XR electronic device 20 described in this document may have more or fewer constituting elements than those listed above.

More specifically, among the constituting elements above, the wireless communication unit 21 may include one or more modules which enable wireless communication between the XR electronic device 20 and a wireless communication system, between the XR electronic device 20 and other electronic devices, or between the XR electronic device 20 and an external server. In addition, the wireless communication unit 21 may include one or more modules that connect the XR electronic device 20 to one or more networks.

The wireless communication unit 21 may include at least one of a broadcast receiving module, a mobile communication module, a wireless Internet module, a short-range a communication module, or a location information module.

The input unit 22 may include a camera or an image input unit for receiving an image signal, a microphone or an audio input unit for receiving an audio signal, and a user input unit (for example, a touch key) for receiving information from the user, and a push key (for example, a mechanical key). Voice data or image data collected by the input unit 22 may be analyzed and processed as a control command of the user.

The sensing unit 23 may include one or more sensors for sensing at least one of internal information of the XR electronic device 20, surrounding environment information of the XR electronic device 20, or user information.

For example, the sensing unit 23 may include at least one of a proximity sensor, an illumination sensor, a touch sensor, an acceleration sensor, a magnetic sensor, a G-sensor, a gyroscope sensor, a motion sensor, an RGB sensor, an infrared (IR) sensor, a finger scan sensor, an ultrasonic sensor, an optical sensor (for example, an image capturing means), a microphone, a battery gauge, an environment sensor (for example, a barometer, a hygrometer, a radiation detection sensor, a heat detection sensor, and a gas detection sensor), or a chemical sensor (for example, an electronic nose, a health-care sensor, and a biometric sensor). Meanwhile, the XR electronic device 20 disclosed in the present specification may utilize information collected from at least two or more sensors listed above.

The output unit 24 is intended to generate an output related to a visual, aural, or tactile stimulus, and may include at least one of a display unit, a sound output unit, a haptic module, or an optical output unit. The display unit may implement a touchscreen by forming a layered structure or being integrated with touch sensors. The touchscreen may not only function as a user input means for providing an input interface between the XR electronic device 20 and the user, but also provide an output interface between the XR electronic device 20 and the user.

The interface 25 serves as a path between various types of external devices connected to the XR electronic device 20. Through the interface 25, the XR electronic device 20 may receive VR or AR content from an external device and perform interaction by exchanging various input signals, sensing signals, and data.

For example, the interface 25 may include at least one of a wired/wireless headset port, an external charging port, a wired/wireless data port, a memory card port, a port for connecting to a device equipped with an identification module, an audio input/output (I/O) port, a video I/O port, or an earphone port.

In addition, the memory 26 stores data supporting various functions of the XR electronic device 20. The memory 26 may store a plurality of application programs (or applications) executed in the XR electronic device 20, and data and commands for operation of the XR electronic device 20. At least some of the application programs may be downloaded via an external server through wireless communication. Furthermore, for basic functions of the XR electronic device 20 (for example, an incoming and outgoing call function and a message reception and transmission function), at least some of the application programs may be pre-installed in the XR electronic device 20 from the time of factory shipment.

The controller 27 usually controls the overall operation of the XR electronic device 20 in addition to the operation related to the application programs. The controller 27 may process signals, data, and information inputted or outputted through the constituting elements described above.

In addition, by executing an application program stored in the memory 26 and controlling at least some of the constituting elements, the controller 27 may provide relevant information or process a function for the user. Furthermore, the controller 27 may combine and operate at least two or more constituting elements among those constituting elements included in the XR electronic device 20 to operate the application program.

Furthermore, the controller 27 may detect motion of the XR electronic device 20 or user by using a gyroscope sensor, a g-sensor, or a motion sensor included in the sensing unit 23. Furthermore, the controller 27 may detect an object approaching the vicinity of the XR electronic device 20 or the user by using a proximity sensor, an illumination sensor, a magnetic sensor, an infrared sensor, an ultrasonic sensor, or a light sensor included in the sensing unit 23. In addition, the controller 27 may detect the motion of the user through sensors installed at a controller operating in conjunction with the XR electronic device 20.

Furthermore, the controller 27 may perform an operation (or function) of the XR electronic device 20 by using an application program stored in the memory 26.

The power supply 28 receives external or internal power under the control of the controller 27, and supplies power to each constituting element included in the XR electronic device 20. The power supply 28 includes a battery, which may be provided in a built-in or replaceable form.

At least some of the constituting elements described above may operate in conjunction with each other to implement the operation, control, or control method of the electronic device according to various embodiments described below. Furthermore, the operation, control, or control method of the electronic device may be implemented in the XR electronic device 20 by executing at least one application program stored in the memory 26.

In what follows, the XR electronic device 20 according to an embodiment of the present disclosure will be described with reference to an example where the XR electronic device 20 is applied to a HMD. However, embodiments of the XR electronic device 20 according to the present disclosure may include a mobile phone, a smartphone, a laptop computer, a digital broadcast terminal, a personal digital assistant (PDA), a portable multimedia player (PMP), a navigation terminal, a slate PC, a tablet PC, an Ultrabook, and a wearable device. Wearable devices may include a smart watch and a smart contact lens, in addition to the HMD.

Figure 3:
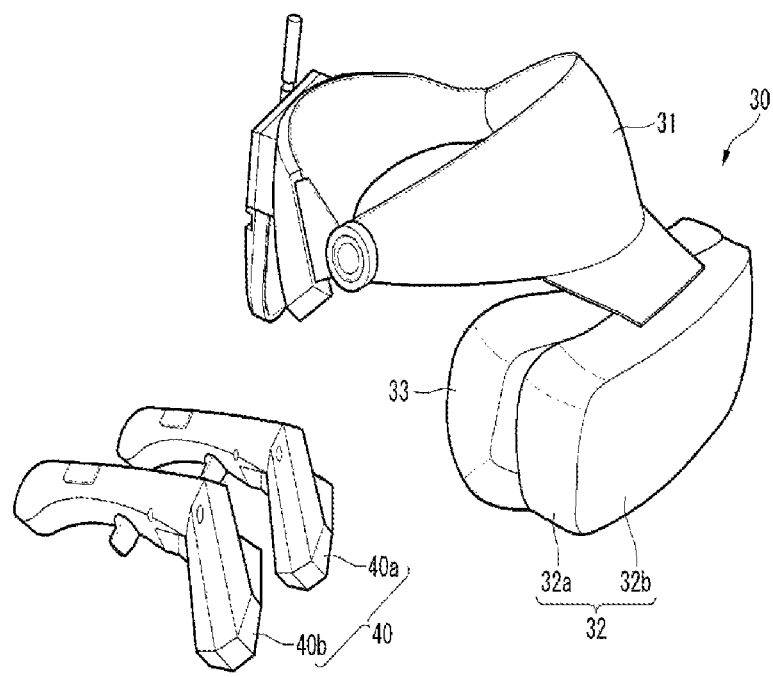
FIG. 3 is a perspective view of a VR electronic device according to an embodiment of the present disclosure.
Figure 4:
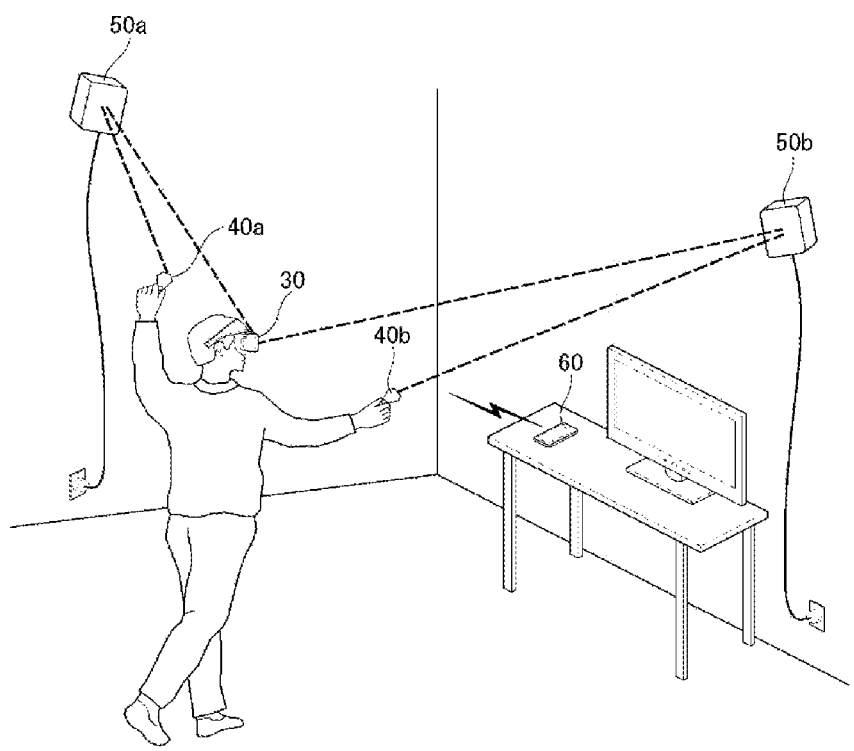
FIG. 4 is a view illustrating a situation in which the VR electronic device of FIG. 3 is used.

FIG. 3 is a perspective view of a VR electronic device according to an embodiment of the present disclosure, and FIG. 4 illustrates a situation in which the VR electronic device of FIG. 3 is used.

Referring to the figures, the VR electronic device may include a box-type electronic device 30 mounted on the head of the user and controllers 40 (40a, 40b) that the user may grip and manipulate.

The electronic device 30 includes a head unit 31 worn on and supported by the head of the user and a display 32 combined with the head unit 31 and displaying a virtual image or video in front of the eyes of the user. Although in FIG. 3 the head unit 31 and display 32 are shown as separate units that are combined together, the display 32 may also be integrally formed with the head unit 31.

The head unit 31 may employ a structure that encloses the head of the user so as to disperse the weight of the display 32. In order to accommodate different head sizes of users, the head unit 31 may be provided with a band of variable length.

The display 32 includes a cover unit 32a combined with the head unit 31 and a display unit 32b containing a display panel.

The cover unit 32a is also called a goggle frame, and the whole of the cover unit 32a may have the shape of a tub. The cover unit 32a has a space formed therein, and an opening is formed at the front surface of the cover unit 32a, the position of which corresponds to the eyes of the user.

The display unit 32b is installed on the front surface frame of the cover unit 32a, and is disposed at the position corresponding to the eyes of the user so as to display screen information (e.g., image or video). The screen information outputted on the display unit 32b includes not only VR content, but also external images collected through an image capturing means such as a camera.

VR content displayed on the display unit 32b may be content stored in the electronic device 30 itself or content stored in an external device 60. For example, when the screen information is an image of the virtual world stored in the electronic device 30, the electronic device 30 may perform image processing and rendering to process the image of the virtual world, and display image information generated from the image processing and rendering through the display unit 32b. In the case of a VR image stored in the external device 60, the external device 60 performs image processing and rendering and transmits image information generated from the image processing and rendering to the electronic device 30. The electronic device 30 may then output 3D image information received from the external device 60 through the display unit 32b.

The display unit 32b may include a display panel installed at the front of the opening of the cover 32a, and the display panel may be an LCD or OLED panel. Similarly, the display unit 32b may be a display unit of a smartphone. In other words, a structure in which a smartphone may be attached to or detached from the front of the cover 32a may be adopted.

Furthermore, an image capturing means and various types of sensors may be installed at the front of the display 32.

The image capturing means (for example, a camera) is configured to capture (receive or input) the image of the front, and may obtain an image of the real world as seen by the user. One image capturing means may be installed at the center of the display unit 32b, or two or more of them may be installed at symmetric positions. When a plurality of image capturing means are installed, a stereoscopic image may be obtained. An image combining an external image obtained from an image capturing means with a virtual image may be displayed through the display unit 32b.

The various types of sensors may include a gyroscope sensor, a motion sensor, or an infrared (IR) sensor. The various types of sensors will be described in more detail below.

At the rear of the display 32, a facial pad 33 may be installed. The facial pad 33 is made of a cushion material and is fitted to the region around the eyes of the user, providing a comfortable fit to the face of the user. Furthermore, the facial pad 33 is made of a flexible material with a shape corresponding to the front contour of the human face and may be fitted to the facial shape of a different user, and thereby blocks external light from entering the eyes.

In addition to the above, the electronic device 30 may be equipped with a user input unit operated to receive a control command, sound output unit, and controller. Descriptions of the aforementioned units are the same as give previously and will be omitted.

Furthermore, the VR electronic device may be provided with controllers 40 (40a, 40b) as peripheral devices for controlling operations related to VR images displayed through the box-type electronic device 30.

The controllers 40 are provided in a form which the user can easily grip by using his or her hands, and the outer surface of the controllers 40 may have a touchpad (or trackpad) or buttons for receiving a user input.

The controllers 40 may be used to control the screen that is outputted on the display unit 32b in conjunction with the electronic device 30. The controllers 40 may include a grip unit that the user grips and a head unit extending from the grip unit and equipped with various sensors and a microprocessor. The grip unit may be shaped as a long vertical bar so that the user may easily grip the grip unit, and the head unit may be formed in a ring shape.

Furthermore, the controllers 40 may include an IR sensor, a motion tracking sensor, a microprocessor, and an input unit. For example, the IR sensor receives light emitted from a position tracking device 50, to be described below, and tracks the motion of the user. The motion tracking sensor may be configured as a single sensor suite integrating a 3-axis acceleration sensor, 3-axis gyroscope, and a digital motion processor.

Furthermore, the grip unit of the controllers 40 may provide a user input unit. For example, the user input unit may include keys disposed inside the grip unit, a touchpad (trackpad) equipped outside the grip unit, and a trigger button.

Meanwhile, the controllers 40 may perform a feedback operation corresponding to a signal received from the controller 27 of the electronic device 30. For example, the controllers 40 may deliver a feedback signal to the user in the form of vibration, sound, or light.

Furthermore, by operating the controllers 40, the user may access an external environment image seen through the camera installed in the electronic device 30. In other words, even in the middle of experiencing the virtual world, the user may immediately check the surrounding environment by operating the controllers 40, without taking off the electronic device 30.

In addition, the VR electronic device may further include a position tracking device 50. The position tracking device 50 detects the position of the electronic device 30 or the controllers 40 by applying a position tracking technique called a lighthouse system, and helps tracking the 360-degree motion of the user.

The position tacking system may be implemented by installing one or more position tracking devices 50 (50a, 50b) in a specific closed space. A plurality of position tracking devices 50 may be installed at positions which maximize the extent of the space in which recognition is possible, for example, at positions facing each other in the diagonal direction.

The electronic device 30 or the controllers 40 may receive light emitted from an light emitting diode (LED) or a laser emitter included in the plurality of position tracking devices 50, and based on a correlation between the time and position at which the corresponding light is received may determine an accurate position of the user in a specific closed space. For this purpose, each of the position tracking devices 50 may include an IR lamp and a 2-axis motor, through which a signal is exchanged with the electronic device 30 or the controllers 40.

Furthermore, the electronic device 30 may perform wired/wireless communication with an external device 60 (for example, a PC, a smartphone, or a tablet PC). The electronic device 30 may receive images of the virtual world stored in the connected external device 60 and display the received image to the user.

Meanwhile, since the controllers 40 and position tracking device 50 described above are not essential elements, they may be omitted in the embodiments of the present disclosure. For example, an input device installed in the electronic device 30 may replace the controllers 40, and position information may be determined independently from various sensors installed in the electronic device 30.

Figure 5:
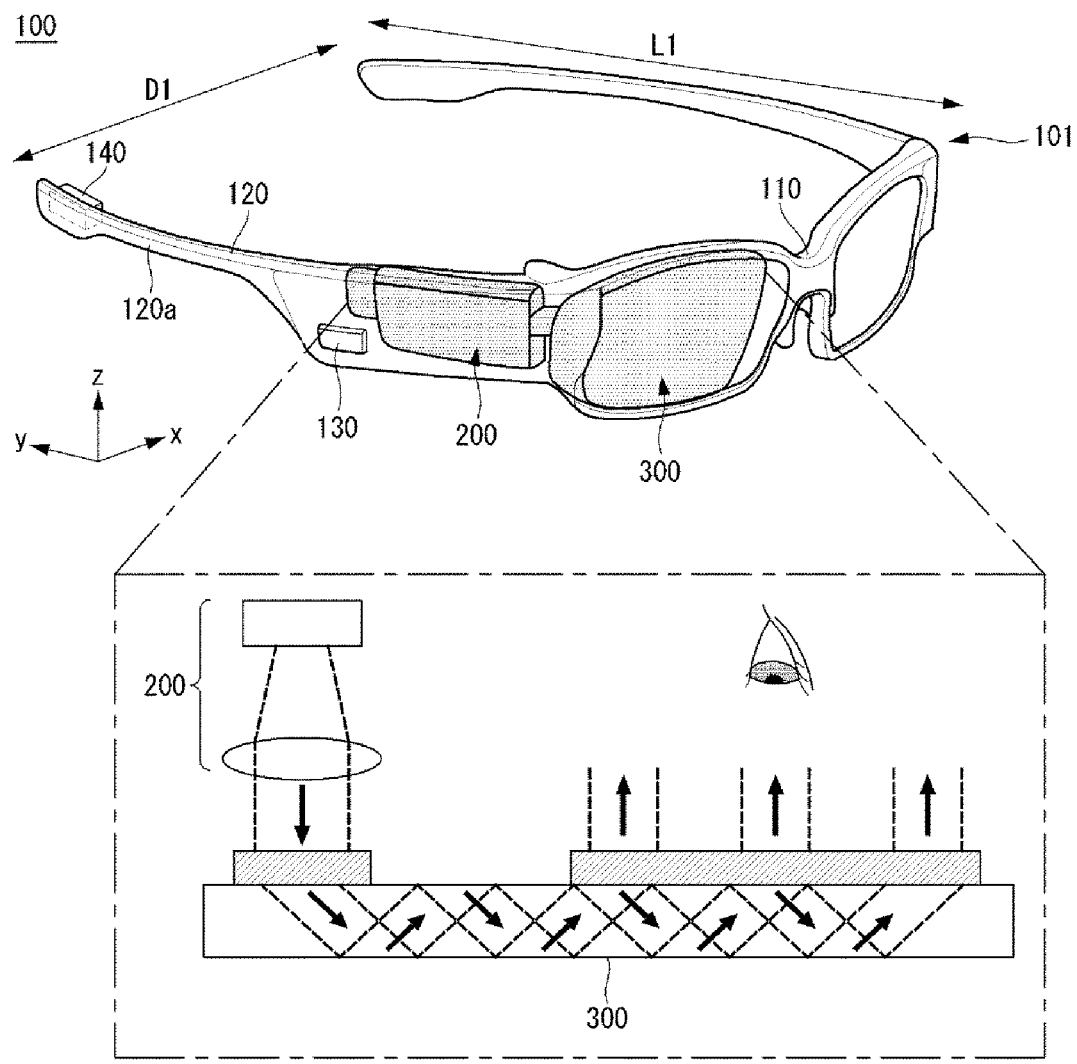
FIG. 5 is a perspective view of an AR electronic device according to an embodiment of the present disclosure.

FIG. 5 is a perspective view of an AR electronic device according to an embodiment of the present disclosure.

As shown in FIG. 5, the electronic device 100 according to an embodiment of the present disclosure may include a frame 101, a controller 200, and a display unit 300.

The electronic device 100 may be provided in the form of smart glasses. The smart glasses-type electronic device may be shaped to be worn on the head of the user, for which the frame (case or housing) 101 may be used. The frame 101 may be made of a flexible material so that the user may wear the glass-type electronic device comfortably.

The frame 101 is supported by the head of the user, and provides a space in which various components are installed. As shown in the figure, electronic components such as the controller 200, a user input unit 130, or a sound output unit 140 may be installed in the frame 101. Furthermore, a lens that covers at least one of the left or right eyes may be installed in the frame 101 in a detachable manner.

As shown in the figure, the frame 101 may have a shape of glasses worn on the face of the user. However, the frame 101 of present disclosure is not limited to a specific shape, and may be provided, for example, in the form of goggles worn in close contact with the eyes of the user.

The frame 101 may include a front frame 110 having at least one opening, and one pair of side frames 120 which are parallel to each other and extend in a first direction (y), and which are intersected by the front frame 110.

The controller 200 is configured to control various electronic components installed in the electronic device.

The controller 200 may generate an image shown to the user or video comprising successive images. The controller 200 may include an image source panel that generates an image and a plurality of lenses that diffuse and converge light generated from the image source panel.

The controller 200 may be fixed to either of the two side frames 120. For example, the controller 200 may be fixed in the inner or outer surface of one side frame 120 or embedded inside one of the side frames 120. Alternatively, the controller 200 may be fixed to the front frame 110 or provided separately from the electronic device.

The display unit 300 may be implemented in the form of an HMD. An HMD refers to a particular type of display device that is worn on the head and shows an image directly in front of the eyes of the user. The display unit 300 may be disposed to correspond to at least one of the left or right eyes so that images may be shown directly in front of the eye(s) of the user when the user wears the electronic device. The present FIG. 5 illustrates a case where the display unit 300 is disposed at the position corresponding to the right eye of the user so that images may be outputted toward the right eye of the user.

The display unit 300 may be configured such that an image generated by the controller 200 is shown to the user while the user at the same time visually recognizes the external environment. For example, the display unit 300 may project an image on the display area by using a prism.

Furthermore, the display unit 300 may be formed to be transparent so that a projected image and a normal view (the visible part of the world as seen through the eyes of the user) in the front are shown at the same time. For example, the display unit 300 may be translucent and made of optical elements including glass.

Furthermore, the display unit 300 may be fixed by being inserted into an opening included in the front frame 110, or may be fixed on the front frame 110 by being positioned on the rear surface of the opening (namely between the opening and the eyes of the user). Although FIG. 5 illustrates an example where the display unit 300 is fixed on the front frame 110 by being positioned on the rear surface of the rear surface, the display unit 300 may be disposed and fixed at various positions of the frame 101.

As shown in FIG. 5, the electronic device may be configured such that when the controller 200 projects image light about an image onto one side of the display unit 300, the light is emitted to the other side of the display unit, and the image generated by the controller 200 is shown to the user.

Accordingly, the user may see the image generated by the controller 200 while at the same time seeing the external environment through the opening of the frame 101. In other words, the image outputted through the display unit 300 may be seen as being overlapped with a normal view. By using the display characteristic described above, the electronic device may provide an AR experience which shows a virtual image overlapped with a real image or background as a single, interwoven image.

Figure 6:
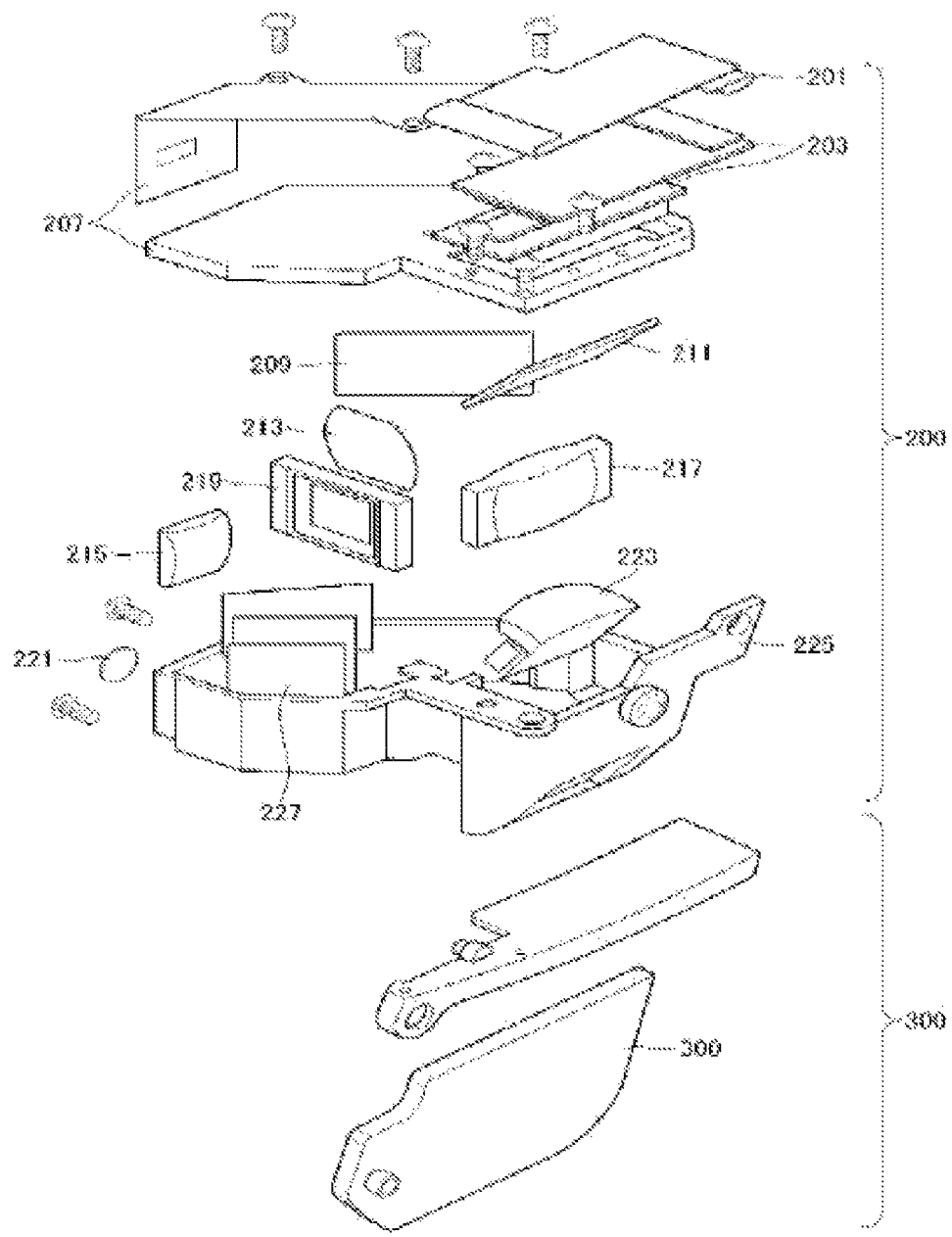
FIG. 6 is an exploded perspective view of a controller according to an embodiment of the present disclosure.

FIG. 6 is an exploded perspective view of a controller according to an embodiment of the present disclosure.

Referring to FIG. 6, the controller 200 may include a first cover 207 and second cover 225 for protecting internal constituting elements and forming the exterior of the controller 200. Inside the first 207 and second 225 covers are included a driving unit 201, an image source panel 203, a polarization beam splitter filter (PBSF) 211, a mirror 209, a plurality of lenses 213, 215, 217, 221, a fly eye lens (FEL) 219, a dichroic filter 227, and a freeform prism projection lens (FPL) 223.

The first cover 207 and the second cover 225 provide a space in which the driving unit 201, the image source panel 203, the PBSF 211, the mirror 209, the plurality of lenses 213, 215, 217, 221, the FEL 219, and the FPL 223 may be installed, and the internal constituting elements are packaged and fixed to either of the side frames 120.

The driving unit 201 may supply a driving signal that controls a video or an image displayed on the image source panel 203, and may be linked to a separate modular driving chip installed inside or outside the controller 200. The driving unit 201 may be installed in the form of a flexible printed circuits board (FPCB), which may be equipped with a heatsink that dissipates heat generated during operation to the outside. In some implementations, the driving unit 201 may correspond to one or more processors. In some implementations, the driving unit 201 may correspond to software components configured to be executed by one or more processors.

The image source panel 203 may generate an image according to a driving signal provided by the driving unit 201 and emit light according to the generated image. To this purpose, the image source panel 203 may use a liquid crystal display (LCD) or organic light emitting diode (OLED) panel.

According to a rotation angle of the image light from the image generated by the image source panel 203, the PBSF 211 may separate the image light or block or pass some of the image light. Therefore, for example, when the image light emitted from the image source panel 203 is composed of a P wave, which is horizontal light, and an S wave, which is vertical light, the PBSF 211 may separate the P and S waves into different light paths or pass the image light of one polarization or block the image light of the other polarization. In an embodiment, the PBSF 211 may be provided as a cube type or plate type.

The cube-type PBSF 211 may filter the image light composed of P and S waves and separate them into different light paths, while the plate-type PBSF 211 may pass the image light of one of the P or S waves but block the image light of the other polarization.

The mirror 209 reflects the image light separated from polarization by the PBSF 211 to collect the polarized image light again and let the collected image light be incident on a plurality of lenses 213, 215, 217, 221.

The plurality of lenses 213, 215, 217, 221 may include convex and concave lenses, and may include, for example, I-type lenses and C-type lenses. The plurality of lenses 213, 215, 217, 221 repeat diffusion and convergence of image light incident on the lenses, thereby improving straightness of the image light.

The FEL 219 may receive the image light which has passed through the plurality of lenses 213, 215, 217, 221, and emit the image light so as to improve illuminance uniformity and extend the area exhibiting uniform illuminance due to the image light.

The dichroic filter 227 may include a plurality of films or lenses, and pass light of a specific range of wavelengths from the image light incoming from the FEL 219 while reflecting light not belonging to the specific range of wavelengths, thereby adjusting the color of the image light. The image light which has passed the dichroic filter 227 may pass through the FPL 223 and be emitted to the display unit 300.

The display unit 300 may receive the image light emitted from the controller 200 and emit the incident image light in the direction in which the eyes of the user are located.

Meanwhile, in addition to the constituting elements described above, the electronic device may include one or more image capturing means (not shown). The image capturing means, being disposed close to at least one of the left or right eyes, may capture the image of the front area. Alternatively, the image capturing means may be disposed so as to capture the image of the side/rear area.

Since the image capturing means is disposed close to the eye, the image capturing means may obtain an image of the real world seen by the user. The image capturing means may also be installed at the frame 101, or be arranged in plural numbers so as to obtain a stereoscopic image.

The electronic device may provide a user input unit 130, which is manipulated in order to input control commands. The user input unit 130 may adopt various inputting methods, including a tactile manner in which the user input unit 130 senses a tactile stimulus, such as a touch or push motion, from the user, a gesture manner in which the user input unit 130 recognizes a hand motion of the user without a direct touch, or a manner in which the user input unit 130 recognizes a voice command. The present figure illustrates a case where the user input unit 130 is installed in the frame 101.

Furthermore, the electronic device may be equipped with a microphone which receives a sound and converts the received sound to electrical voice data, and a sound output unit 140 that outputs a sound. The sound output unit 140 may be configured to transfer a sound through an ordinary sound output scheme or a bone conduction scheme. When the sound output unit 140 is configured to operate according to the bone conduction scheme, the sound output unit 140 is fitted to the head when the user wears the electronic device, and transmits sound by vibrating the skull.

In what follows, various forms of the display unit 300 and various methods for emitting incident image light will be described.

FIGS. 7 to 13 illustrate various display methods applicable to the display unit 300 according to an embodiment of the present disclosure.

Figure 12:
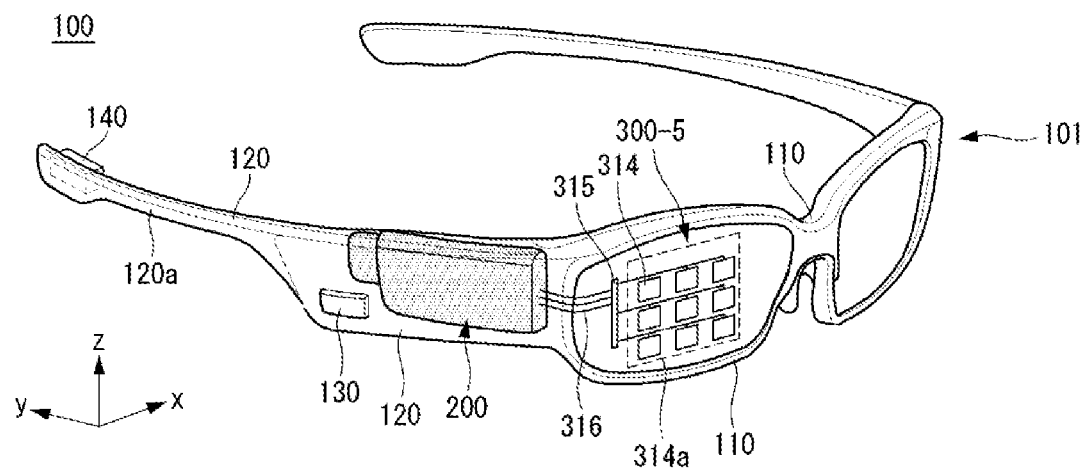
Figure 13:
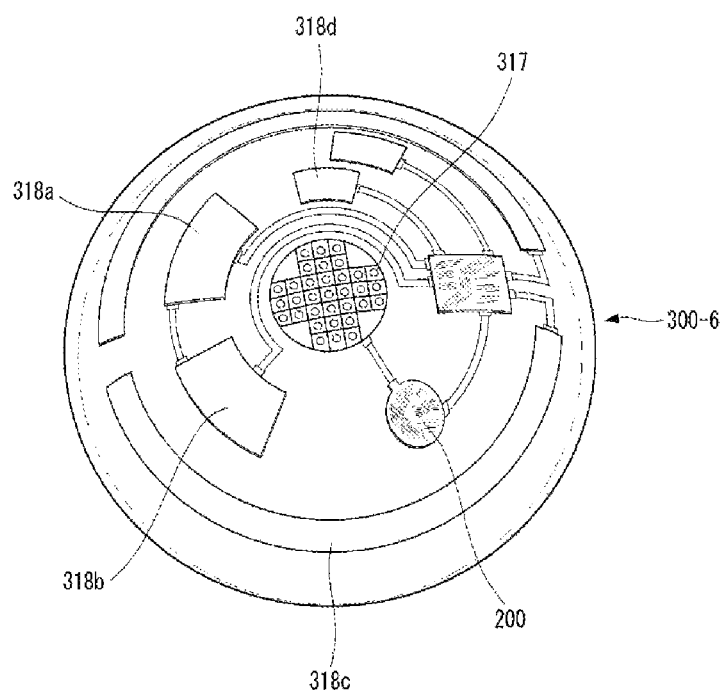

More specifically, FIG. 7 illustrates an embodiment of a prism-type optical element, FIG. 8 illustrates an embodiment of a waveguide-type optical element, FIGS. 9 and 10 illustrate an embodiment of a pin mirror-type optical element, and FIG. 11 illustrates an embodiment of a surface reflection-type optical element. In addition, FIG. 12 illustrates an embodiment of a micro-LED type optical element, and FIG. 13 illustrates an embodiment of a display unit used for contact lenses.

As shown in FIG. 7, the display unit 300-1 according to an embodiment of the present disclosure may use a prism-type optical element.

Figure 7A:
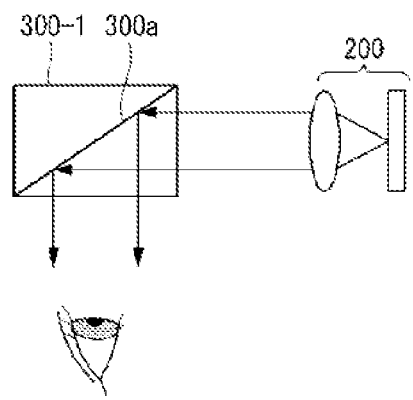
FIGS. 7 to 13 are conceptual views illustrating various display methods applicable to a display unit according to an embodiment of the present disclosure.
Figure 7B:
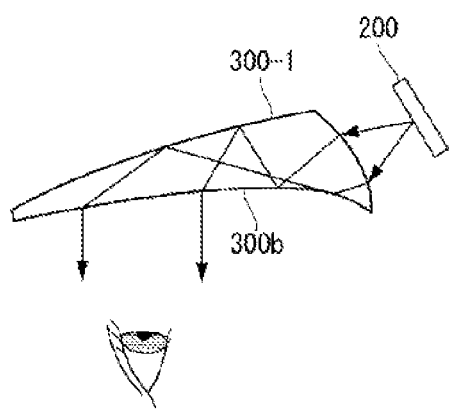

In an embodiment, as shown in FIG. 7A, the prism-type optical element may use a flat-type glass optical element in which the surface on which image light is incident and from which the image light is emitted is planar, or as shown in FIG. 7B, may use a freeform glass optical element in which the surface 300b from which the image light is emitted is formed by a curved surface without a fixed radius of curvature.

The flat-type glass optical element may receive the image light generated by the controller 200 through the flat side surface and reflect the received image light by using a total reflection mirror 300a installed inside, and emit the reflected image light toward the user. Here, a laser is used to form the total reflection mirror 300a installed inside the flat-type glass optical element.

The freeform glass optical element is configured such that its thickness becomes thinner the further away from the surface on which light is incident, and may receive image light generated by the controller 200 through a side surface having a finite radius of curvature and totally reflect the received image light, and emit the reflected light toward the user.

As shown in FIG. 8, a display unit 300-2 according to another embodiment of the present disclosure may use a waveguide-type optical element or a light guide optical element (LOE).

Figure 8A:
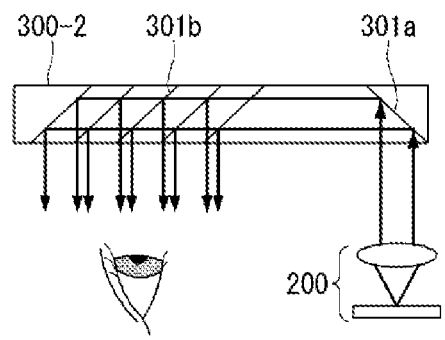
Figure 8B:
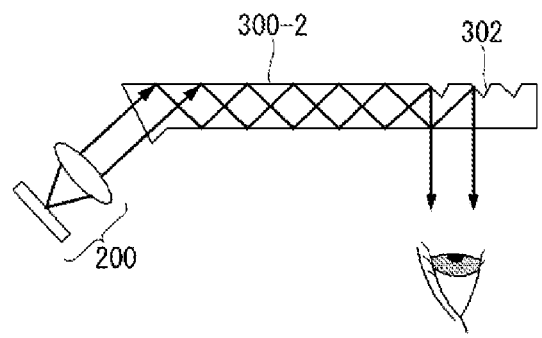
Figure 8C:
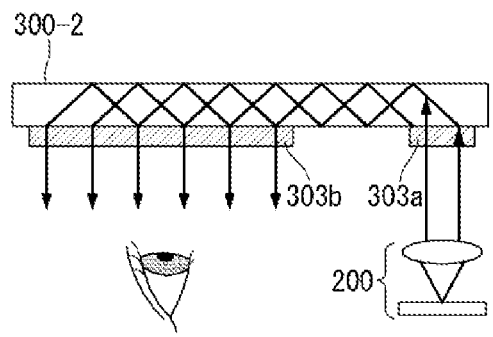
Figure 8D:
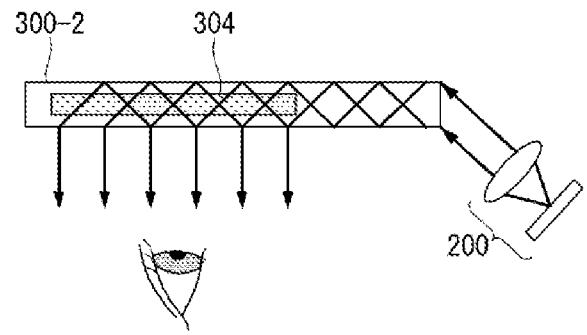
Figure 8E:
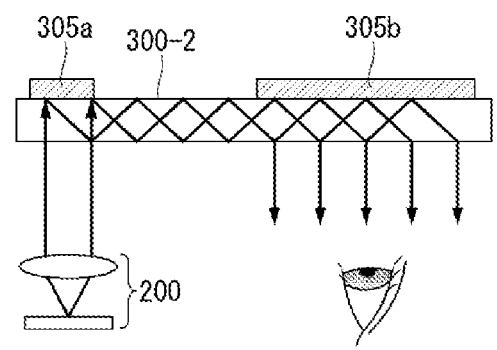
Figure 8F:
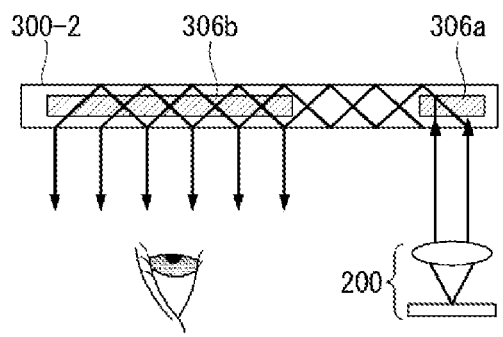

As an embodiment, the waveguide or light guide-type optical element may be implemented by using a segmented beam splitter-type glass optical element as shown in FIG. 8A, a saw tooth prism-type glass optical element as shown in FIG. 8B, a glass optical element having a diffractive optical element (DOE) as shown in FIG. 8C, a glass optical element having a hologram optical element (HOE) as shown in FIG. 8D, a glass optical element having a passive grating as shown in FIG. 8E, and a glass optical element having an active grating as shown in FIG. 8F.

As shown in FIG. 8A, the segmented beam splitter-type glass optical element may have a total reflection mirror 301a where an optical image is incident, and a segmented beam splitter 301b where the optical image is emitted.

Accordingly, the optical image generated by the controller 200 is totally reflected by the total reflection mirror 301a inside the glass optical element, and the totally reflected optical image is partially separated and emitted by the partial reflection mirror and eventually perceived by the user while being guided along the longitudinal direction of the glass.

In the case of the saw tooth prism-type glass optical element as shown in FIG. 8B, the optical image generated by the controller 200 is incident on the side surface of the glass in the oblique direction and totally reflected into the inside of the glass, emitted to the outside of the glass by a saw tooth-shaped uneven structure 302 formed where the optical image is emitted, and eventually perceived by the user.

The glass optical element having a diffractive optical element (DOE) as shown in FIG. 8C may have a first diffractive unit 303a on the surface of the part on which the optical image is incident, and a second diffractive unit 303b on the surface of the part from which the optical image is emitted. The first and second diffractive units 303a, 303b may be provided in such a way that a specific pattern is patterned on the surface of the glass, or a separate diffractive film is attached thereon.

Accordingly, the optical image generated by the controller 200 is diffracted as the optical image passes through the first diffractive unit 303a, guided along the longitudinal direction of the glass while being totally reflected, emitted through the second diffractive unit 303b, and eventually perceived by the user.

The glass optical element having a hologram optical element (HOE) as shown in FIG. 8D may have an out-coupler 304 inside the glass from which an optical image is emitted. Accordingly, the optical image is irradiated from the controller 200 in the oblique direction through the side surface of the glass, totally reflected and guided along the longitudinal direction of the glass, emitted by the out-coupler 304, and eventually perceived by the user. The structure of the HOE may be modified to be further divided into the structure having a passive grating and the structure having an active grating.

The glass optical element having a passive grating as shown in FIG. 8E may have an in-coupler 305a on the opposite surface of the glass surface on which the optical image is incident and an out-coupler 305b on the opposite surface of the glass surface from which the optical image is emitted. Here, the in-coupler 305a and the out-coupler 305b may be provided in the form of a film having a passive grating.

Accordingly, the optical image incident on the glass surface at the light-incident side of the glass is totally reflected by the in-coupler 305a installed on the opposite surface, guided along the longitudinal direction of the glass, emitted through the opposite surface of the glass by the out-coupler 305b, and eventually perceived by the user.

The glass optical element having an active grating as shown in FIG. 8F may have an in-coupler 306a formed as an active grating inside the glass through which an optical image is incoming, and an out-coupler 306b formed as an active grating inside the glass from which the optical image is emitted.

Accordingly, the optical image incident on the glass is totally reflected by the in-coupler 306a, guided in the longitudinal direction of the glass, emitted to the outside of the glass by the out-coupler 306b, and eventually perceived by the user.

A display unit 300-3 according to another embodiment of the present disclosure may use a pin mirror-type optical element.

The pinhole effect is referred to as such because a hole through which an object is viewed is like one made with the point of a pin, and refers to the effect of making an object more clearly seen as light is passed through a small hole. This effect results from the nature of light due to refraction of light, and the light passing through the pinhole deepens the depth of field (DOF), which makes the image formed on the retina more vivid.

In what follows, an embodiment for using a pin mirror-type optical element will be described with reference to FIGS. 9 and 10.

Figure 9A:
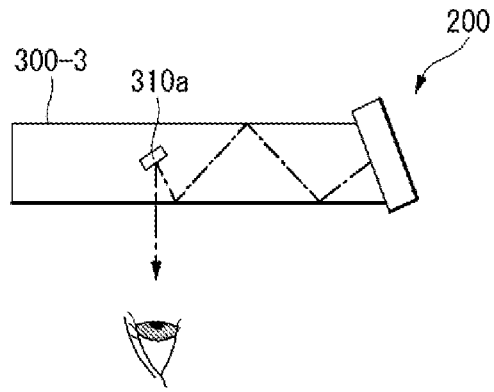

Referring to FIG. 9A, a pinhole mirror 310a may be provided on the path of incident light within the display unit 300-3, and reflect the incident light toward the eyes of the user. More specifically, the pinhole mirror 310a may be disposed between the front surface (outer surface) and the rear surface (inner surface) of the display unit 300-3. A method for manufacturing the pinhole mirror will be described again below.

The pinhole mirror 310a may be formed to be smaller than the pupil of the eye, and to provide a deep depth of field. Therefore, even if the focal length for viewing the real world through the display unit 300-3 is changed, the user may still clearly see the real world by overlapping an augmented reality image provided by the controller 200 with the image of the real world.

Furthermore, the display unit 300-3 may provide a path which guides the incident light to the pinhole mirror 310a through internal total reflection.

Figure 9B:
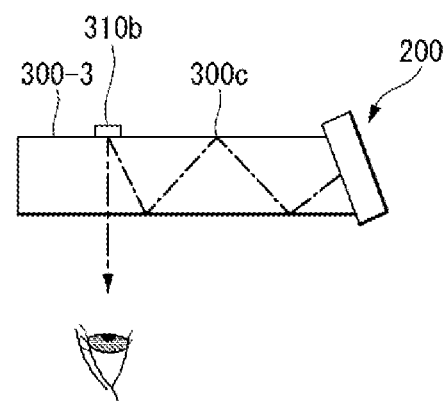

Referring to FIG. 9B, a pinhole mirror 310b may be provided on a surface 300c through which light is totally reflected in the display unit 300-3. Here, the pinhole mirror 310b may have the characteristic of a prism that changes the path of external light according to the eyes of the user. For example, the pinhole mirror 310b may be fabricated as a film-type and be attached to the display unit 300-3, which increases the ease of manufacturing of the pinhole mirror.

The display unit 300-3 may guide the incident light incoming from the controller 200 through internal total reflection, the incident light which is totally reflected may be reflected by the pinhole mirror 310b installed on the surface on which external light is incident, and the reflected light may pass through the display unit 300-3 to reach the eyes of the user.

Figure 9C:
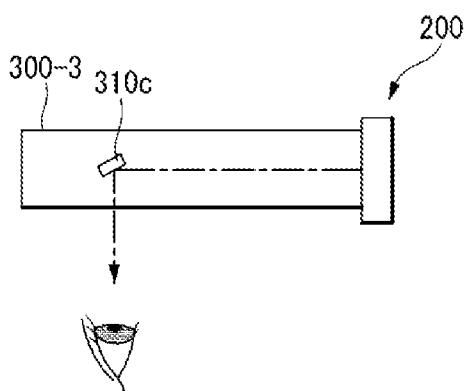

Referring to FIG. 9C, the incident light illuminated by the controller 200 may be reflected by the pinhole mirror 310c directly, without internal total reflection within the display unit 300-3, and reach the eyes of the user. This structure is convenient for the manufacturing process in that augmented reality may be provided irrespective of the shape of the surface through which external light passes within the display unit 300-3.

Figure 9D:
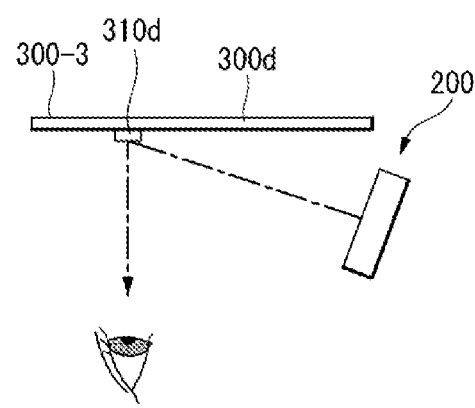

Referring to FIG. 9D, the light illuminated by the controller 200 may reach the eyes of the user by being reflected within the display unit 300-3 by a pinhole mirror 310d installed on a surface 300d from which external light is emitted. The controller 200 is configured to illuminate light at a position separated from the surface of the display unit 300-3 toward the rear surface, and illuminate light toward the surface 300d from which external light is emitted within the display unit 300-3. The present embodiment may be applied easily when the thickness of the display unit 300-3 is not sufficient to accommodate the light illuminated by the controller 200. Furthermore, the present embodiment may be advantageous for manufacturing in that it may be applied irrespective of the surface shape of the display unit 300-3, and the pinhole mirror 310d may be manufactured in a film shape.

Meanwhile, the pinhole mirror 310a, 310b, 310c, or 310d may be provided in plural numbers in an array pattern.

FIG. 10 illustrates the shape of a pinhole mirror and structure of an array pattern according to an embodiment of the present disclosure.

Figure 10A:
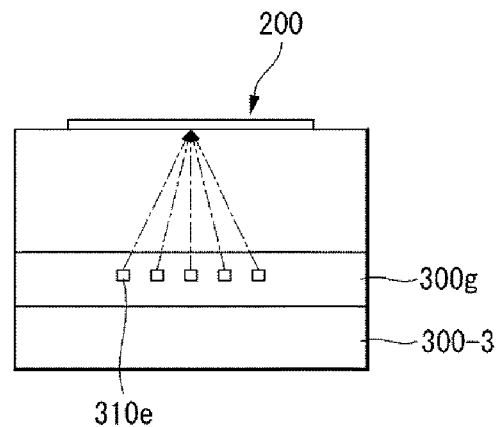
Figure 10B:
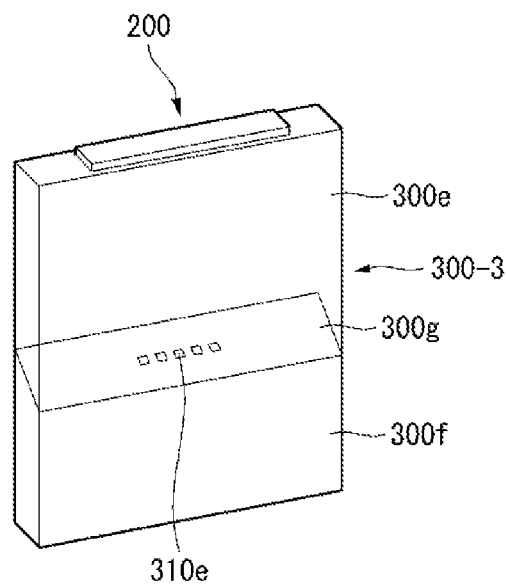

Referring to FIG. 10A, the pinhole mirror may be fabricated in a polygonal structure 310 including a square or rectangular shape. Here, the length (diagonal length) of a longer axis of the pinhole mirror may be the positive square root of the product of the focal length and wavelength of light illuminated in the display unit 300-3.

A plurality of pinhole mirrors 310e are disposed in parallel, being separated from each other, to form an array pattern. The array pattern may form a line pattern or lattice pattern.

Figure 10C:
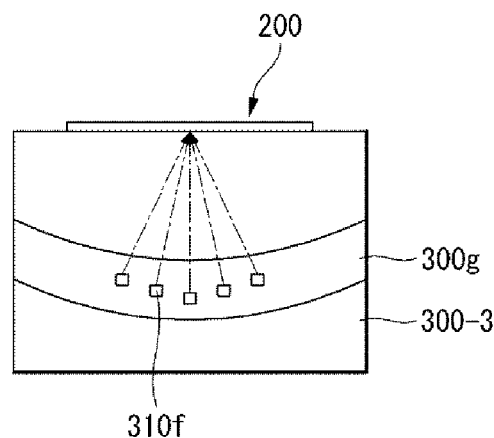
Figure 10D:
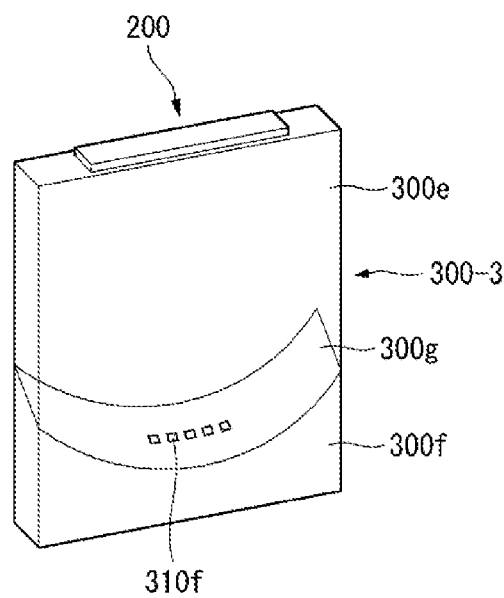

FIGS. 10A and B illustrate a flat pin mirror scheme, and FIGS. 10C and D illustrate a freeform pin mirror scheme.

When the pinhole mirror 310 is installed inside the display unit 300-3, a first glass 300e and a second glass 300f are combined by an inclined surface 300g disposed being inclined toward the pupil of the eye, and a plurality of pinhole mirrors 310e are disposed on the inclined surface 300g and form an array pattern.

Referring to FIGS. 10A and B, a plurality of pinhole mirrors 310e may be disposed side by side along one direction on the inclined surface 300g, and continuously display the augmented reality provided by the controller 200 on the image of the real world seen through the display unit 300-3 even if the user moves the pupil of his or her eye.

Furthermore, referring to FIGS. 10C and D, the plurality of pinhole mirrors 310f may form a radial array 310g on the inclined surface 300g provided as a curved surface.

Since a plurality of pinhole mirrors 310f are disposed along the radial array 310g, the pinhole mirror 310f at the edge in FIG. 10C is disposed at the highest position, and the pinhole mirror 310f in the middle thereof is disposed at the lowest position, the path of a beam emitted by the controller 200 may be matched to each pinhole mirror.

As described above, by disposing a plurality of pinhole arrays 310f along the radial array 310g, the double image problem of augmented reality provided by the controller 200 due to the path difference of light may be resolved.

Similarly, lenses may be attached on the rear surface of the display unit 300-3 to compensate for the path difference of the light reflected from the plurality of pinhole mirrors 310e disposed side by side in a row.

Figure 11A:
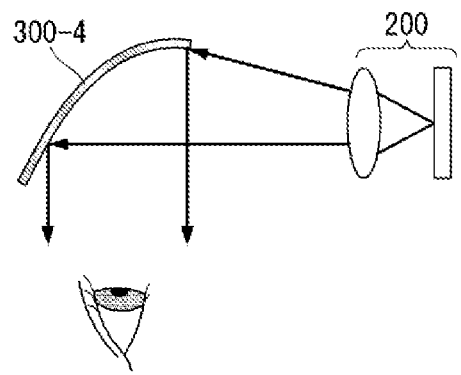
Figure 11B:
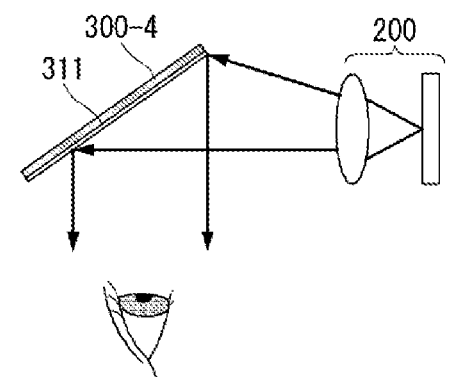
Figure 11C:
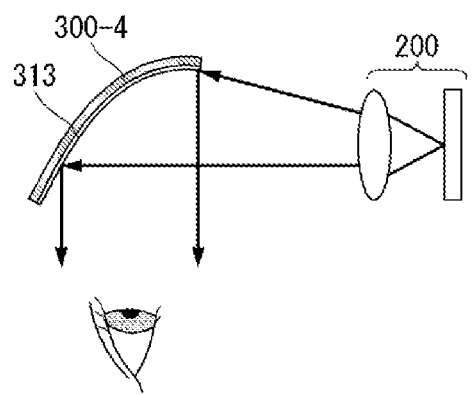

The surface reflection-type optical element that may be applied to a display unit according to another embodiment of the present disclosure may employ a freeform combiner method as shown in FIG. 11A, a flat HOE method as shown in FIG. 11B, and a freeform HOE method as shown in FIG. 11C.

The surface reflection-type optical element based on the freeform combiner method as shown in FIG. 11A may use freeform combiner glass 311-4, for which a plurality of flat surfaces having different incidence angles for an optical image are combined to form one glass with a curved surface as a whole to perform the role of a combiner. The freeform combiner glass 311-4 may emit an optical image to the user by making the incidence angle of the optical image differ in the respective areas.

The surface reflection-type optical element based on the flat HOE method as shown in FIG. 11B may have a hologram optical element (HOE) 311 coated or patterned on the surface of flat glass 311-5, where an optical image emitted by the controller 200 passes through the HOE 311, is reflected from the surface of the glass, again passes through the HOE 311, and is eventually emitted to the user.

The surface reflection-type optical element based on the freeform HOE method as shown in FIG. 11C may have a HOE 313 coated or patterned on the surface of freeform glass 311-4, for which the operating principles may be the same as described with reference to FIG. 11B.

In addition, a display unit 300-5 employing a micro LED as shown in FIG. 12 and a display unit 300-6 employing a contact lens as shown in FIG. 13 may also be used.

Referring to FIG. 12, the optical element of the display unit 300-5 may include a liquid crystal on silicon (LCoS) element, a liquid crystal display (LCD) element, an organic light emitting diode (OLED) display element, and a digital micromirror device (DMD), and the optical element may further include a next-generation display element such as a micro LED and quantum dot (QD) LED displays.

Image data generated by the controller 200 to correspond to an augmented reality image is transmitted to the display unit 300-5 along a conductive input line 316, and the display unit 300-5 may convert the image signal to light through a plurality of optical elements 314 (for example, a micro LED) and emit the converted light to the eyes of the user.

The plurality of optical elements 314 are disposed in a lattice structure (for example, 100×100) to form a display area 314a. The user may see the augmented reality through the display area 314a within the display unit 300-5. Furthermore, the plurality of optical elements 314 may be disposed on a transparent substrate.

The image signal generated by the controller 200 is transmitted to an image split circuit 315 provided at one side of the display unit 300-5, and the image split circuit 315 is divided into a plurality of branches, where the image signal is further transmitted to an optical element 314 disposed at each branch. At this time, the image split circuit 315 may be located outside the field of view of the user so as to minimize gaze interference.

Referring to FIG. 13, the display unit 300-6 may comprise a contact lens. A contact lens 300-6 on which augmented reality may be displayed is also called a smart contact lens. The smart contact lens 300-6 may have a plurality of optical elements 317 in a lattice structure at the center of the smart contact lens.

The smart contact lens 300-6 may include a solar cell 318a, a battery 318b, a controller 200, an antenna 318c, and a sensor 318d in addition to an optical element 317. For example, the sensor 318d may check the blood sugar level in a tear, and the controller 200 may process the signal of the sensor 318d and display the blood sugar level in the form of augmented reality through the optical element 317 so that the user may check the blood sugar level in real-time.

As described above, the display unit 300 according to an embodiment of the present disclosure may be implemented by using one of the prism-type optical element, the waveguide-type optical element, the light guide optical element (LOE), the pin mirror-type optical element, or the surface reflection-type optical element. In addition to the above, an optical element that may be applied to the display unit 300 according to an embodiment of the present disclosure may include a retina scan method.

Figure 14:
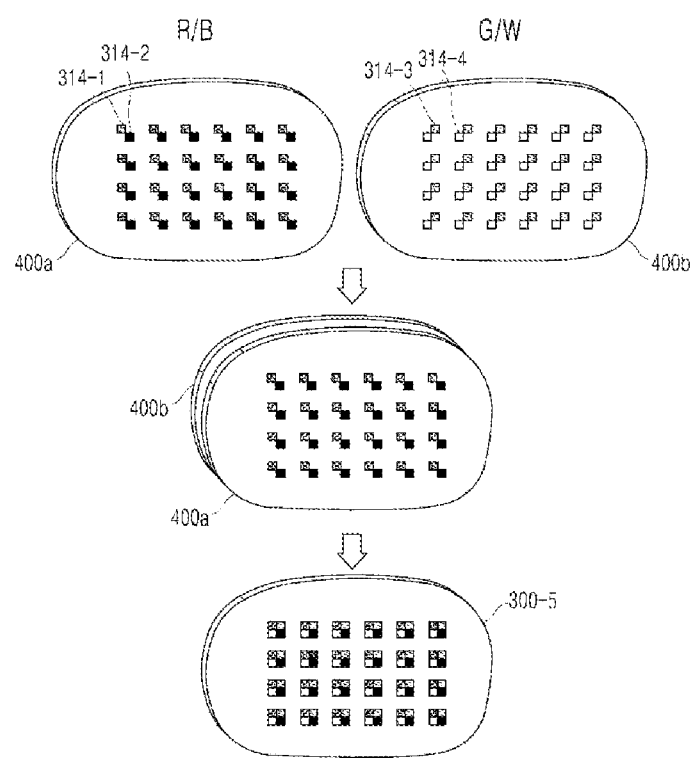
FIG. 14 is a view illustrating one example of the display unit in the electronic device of FIG. 12.
Figure 15:
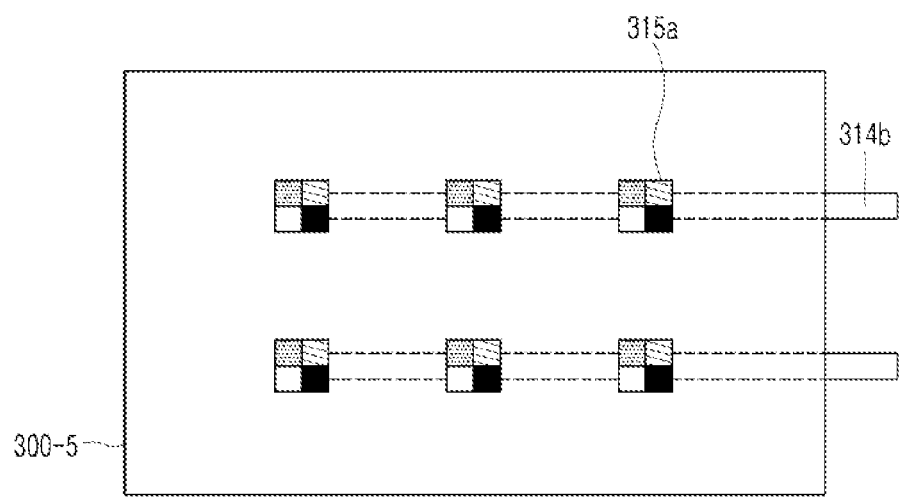
FIG. 15 is a view illustrating in more detail the optical elements in the display unit of FIG. 14.

FIG. 14 is a view illustrating one example of the display unit in the electronic device of FIG. 12. FIG. 15 is a view illustrating in more detail the optical elements in the display unit of FIG. 14. FIG. 16 is a view illustrating a state in which the optical elements mounted on a display panel emit light in the display unit of FIG. 14.

As shown in FIGS. 14 to 16, the electronic device 100 according to an embodiment of the present disclosure includes a first display panel 400a, a second display panel 400b, a first optical element 314-1, a second optical element 314-2, and a third optical element 314-3.

In such a case, the first display panel 400a, the second display panel 400b, the first optical element 314-1, the second optical element 314-2, and the third optical element 314-3 may all correspond to essential components constituting a display unit 300-5.

The display unit 300-5 may be disposed in front of the eyes of the user to present a visual image to the user. The user may view, through the display unit 300-5, images generated by the controller 200 while visually recognizing an external environment.

The first display panel 400a has one surface (a first side) facing the eyes of the user and another surface (a second side) facing a direction opposite to the eyes of the user. In addition, the first display panel 400a may be configured as a plate-shaped member such that the optical elements 314-1 and 314-2 are disposed on at least one surface of these surfaces.

Figure 16A:
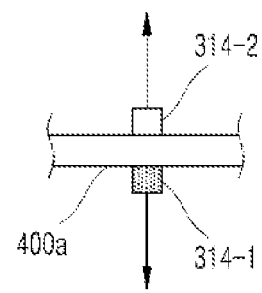
FIG. 16 is a view illustrating a state in which the optical elements mounted on a display panel emit light in the display unit of FIG. 14.

Specifically, as shown in FIG. 16A, the optical elements 314-1 and 314-2 may be mounted on the one surface (first side) and/or the other surface (second side) of the first display panel 400a. To this end, a substrate made of transparent material is formed on the one surface and/or the other surface of the first display panel 400a, and the optical elements 314-1 and 314-2 may be mounted on the substrate.

In addition, the optical elements 314-1 and 314-2 mounted on the substrate may be configured to emit light toward a surface opposite to their mounted surface.

Figure 16B:
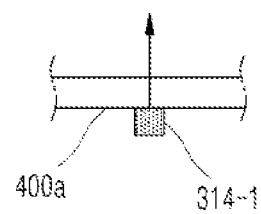

Alternatively, as shown in FIG. 16B, the optical element 314-1 mounted on the substrate may be configured to emit light toward its mounted surface.

An arrangement of the optical elements 314-1, 314-2, 314-3, and 314-4 with respect to the first display panel 400a as described above is applied in the same or a similar manner to the second to fourth display panels 400b, 400c, and 400d which will be described below, so a detailed description of overlapping contents will be omitted.

The second display panel 400b has one surface (first side) stacked on another surface (second side) of the first display panel 400a such that the one surface (first side) of the second display panel 400b overlaps the other surface (second side) of the first display panel 400a. The second display panel 400b may be configured as the plate-shaped member such that the optical elements 314-3 and 314-4 are disposed on at least one surface of these surfaces. Accordingly, the one surface (first side) of the second display panel 400b may be coupled to the other surface (second side) of the first display panel 400a, and the other surface (second side) of the second display panel 400b may face the direction opposite to the eyes of the user.

The first optical element 314-1 is disposed on the first display panel 400a so as to emit any one of red (R) light, green (G) light, and blue (B) light. The first optical element 314-1 converts an image signal according to image data to be implemented into the light, and then emits the converted light.

The first optical element 314-1 may be classified as a non-self-light emitting method or a self-light emitting method. The non-self-light emitting method additionally requires a separate light source with a constraint that a large-scale optical engine must inevitably be configured.

Accordingly, it is preferable that the first optical element 314-1 be configured by the self-light emitting method. However, among the self-light emitting methods, in the case of a full color panel in which red (R), green (G), and blue (B) light sources are all provided in each pixel, there is a constraint that a resolution (PPI, pixels per inch) is relatively lowered.

Accordingly, it may be preferable in terms of the resolution (PPI) to configure the first optical element 314-1 with a mono color panel that emits one of the red (R) light, the green (G) light, or the blue (B) light.

The features of the second to fourth optical elements 314-2, 314-3, and 314-4, which will be described below, are the same as or similar to those of the first optical element 314-1 as described above, so detailed descriptions of the overlapping contents will be omitted.

The second optical element 314-2 is disposed on the first display panel 400a together with the first optical element 314-1 to emit another one of the red (R) light, the green (G) light, and the blue (B) light, and emits light of a different color from the first optical element 314-1.

Accordingly, the first and second optical elements 314-1 and 314-2 that emit two of the red (R) light, the green (G) light, and the blue (B) light are disposed together on the first display panel 400a.

The third optical element 314-3 is disposed on second display panel 400b to emit the remaining one of the red (R) light, the green (G) light, and the blue (B) light, and emits light of a different color from the first optical element 314-1 and the second optical element 314-2.

As a result, the first to third optical elements 314-1, 314-2, and 314-3 configured to emit the red (R) light, the green (G) light, and the blue (B) light, respectively, are not all disposed on any one of the display panels 400a and 400b, but are disposed to be dispersed in two groups on the first and second display panels 400a and 400b.

In addition, as the first display panel 400a and the second display panel 400b on which the first to third optical elements 314-1, 314-2, and 314-3 are disposed to be dispersed are stacked to overlap each other, each of the mono color light emitted from the first to third optical elements 314-1, 314-2, and 314-3 may be combined such that substantially the same function as the full color panel is implemented.

As described above, the electronic device 100 according to the present embodiment may be configured such that optical elements 314-1, 314-2, 314-3, and 314-4 capable of directly emitting light are disposed on display panels 400a, and 400b so that the image light emitted from the optical elements 314-1, 314-2, 314-3, and 314-4 may be transmitted to the eyes of the user through the display panels 400a and 400b, thereby further simplifying the optical paths by transmitting the image light without using a separate optical engine.

Further, in the electronic device 100 according to the present embodiment, the first to third optical elements 314-1, 314-2, and 314-3 emitting the red (R) light, the green (G) light, and the blue (B) light, respectively, may be disposed to be dispersed on the first display panel 400a and the second display panel 400b, thereby ensuring stable images by overcoming a restriction on a resolution (PPI) in a limited area for a display.

Furthermore, in the electronic device 100 according to the present embodiment, the first display panel 400a and the second display panel 400b on which the first to third optical elements 314-1, 314-2, and 314-3 are disposed to be dispersed may be stacked to overlap each other so that light emitted from the first to third optical elements 314-1, 314-2, and 314-3 may be combined with one another, thereby smoothly implementing various colors despite the use of the mono color optical elements 314-1, 314-2, and 314-3.

The electronic device 100 according to the present embodiment may further include a fourth optical element 314-4 disposed on the second display panel 400b together with the third optical element 314-3 to emit white (W) light.

That is, as shown in FIG. 14, the first to fourth optical elements 314-1, 314-2, 314-3, and 314-4 are divided into two kinds of optical elements {314-1, 314-2} and {314-3, 314-4}, and the two kinds of optical elements {314-1, 314-2} and {314-3, 314-4} may be disposed on the first display panel 400a and the second display panel 400b, respectively.

When the display unit 300-5 is configured only by the first to third optical elements 314-1, 314-2, and 314-3 that emit only the red (R) light, the green (G) light, and the blue (B) light, all of the red (R) light, the green (G) light, and the blue (B) light must be emitted in order to express white with only these lights. Therefore, since both durability and efficiency of the display unit 300-5 are poor, there is a limitation in manufacturing a large-scale display unit 300-5.

Therefore, the above problem can be solved by including in the display unit 300-5 the fourth optical element 314-4 in addition to the red (R) light, the green (G) light, and the blue (B) light because the fourth optical element 314-4 can independently emit the white (W) light.

As described above, in the electronic device 100 according to the present embodiment, the fourth optical element 314-4 that emits the white (W) light may be disposed on the second display panel 400b, thereby implementing a large-scale display by improving the durability and the efficiency.

In the electronic device 100 according to the present embodiment, each of the first to fourth optical elements 314-1, 314-2, 314-3, and 314-4 may include a micro LED 315a as shown in FIG. 15.

In such a case, the micro LED 315a refers to a display having an element size of 100 μm or less in width and length, respectively. Since the micro LED 315a emits light by itself without a separate liquid crystal, it may exhibit excellent performance in terms of contrast ratio, reaction speed, viewing angle, brightness, limiting resolution, and life, and the like.

Therefore, when the micro LED 315a is used as the optical elements 314-1, 314-2, 314-3, and 314-4, it is possible to implement the optical elements 314-1, 314-2, 314-3, and 314-4 capable of directly emitting light in the display unit 300-5, as well as to dispose more optical elements 314-1, 314-2, 314-3, and 314-4 in a limited area, as described above.

As described above, in the electronic device 100 according to the present embodiment, the first to fourth optical elements 314-1, 314-2, 314-3, and 314-4 may include the micro LED 315a, thereby implementing a higher resolution while simplifying an overall structure.

In addition, the first to fourth optical elements 314-1, 314-2, 314-3, and 314-4 may further include a transparent electrode 314b electrically connected to the micro LED 315a. That is, as shown in FIG. 15, the plurality of micro LEDs 315a may be mounted on the transparent electrode 314b made of transparent material, which may be configured as a lighting structure.

As described above, in the electronic device 100 according to the present embodiment, the first to fourth optical elements 314-1, 314-2, 314-3, and 314-4 may include the transparent electrode 314b, thereby smoothly supplying power to implement a function of the display.

In the electronic device 100 according to the present embodiment, the illumination paths of the light emitted from each of the first to fourth optical elements 314-1, 314-2, 314-3, and 314-4 may overlap each other.

That is, even though each of the first to fourth optical elements 314-1, 314-2, 314-3, and 314-4 is disposed to be dispersed with one another, as shown in FIG. 14, certain portions of the illumination paths may be adjusted to overlap one another in the stacking process of the first and second display panels 400a and 400b.

In addition, as the illumination paths of the respective light overlap one another as described above, the overlapped light may be, at the point where the light arrives, in a state in which the certain portions of the red (R) light, the green (G) light, the blue (B) light, and the white (W) light are combined. As a result, the respective light is combined within the field of view of the user so that various colors may be implemented.

As described above, in the electronic device 100 according to the present embodiment, the illumination paths of the light emitted from each of the first to fourth optical elements 314-1, 314-2, 314-3, and 314-4 may overlap one another, thereby allowing the light in the illumination paths of the respective light to be effectively combined with one another.

Figure 17:
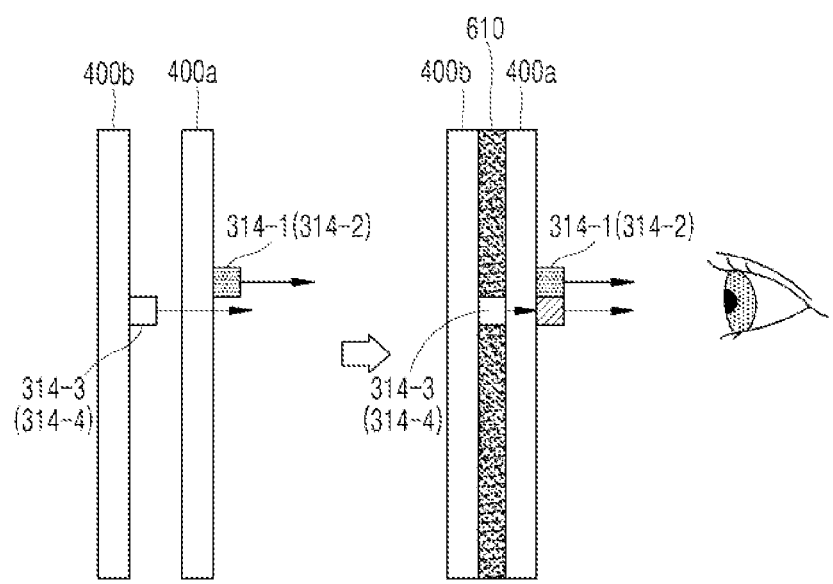
FIG. 17 is a view illustrating a first example of a state in which the display panel and the optical element are coupled to each other in the display unit of FIG. 14.

FIG. 17 is a view illustrating a first example of a state in which the display panel and the optical element are coupled to each other in the display unit of FIG. 14.

As shown in FIG. 17, in the electronic device 100 according to the present embodiment, the first optical element 314-1 and the second optical element 314-2 may be mounted on one surface (first side) of the first display panel 400a to emit the light toward the eyes of the user, and the third optical element 314-3 may be mounted on one surface (first side) of the second display panel 400b to emit the light toward the eyes of the user.

In addition, the fourth optical element 314-4 (not shown in FIG. 17) may also be mounted on one surface of the second display panel 400b to emit the light toward the eyes of the user.

Specifically, the substrate may be disposed on the one surface of the first display panel 400a, and the first optical element 314-1 and the second optical element 314-2 may be configured to be mounted on such substrate to emit the light toward a surface opposite to their mounted surface.

Further, the substrate may also be disposed on the one surface of the second display panel 400b, and the third optical element 314-3 and the fourth optical element 314-4 (not shown in FIG. 17) may be configured to be mounted on such substrate to emit the light toward the surface opposite to their mounted surface.

Accordingly, the certain portion of all light emitted from the first to fourth optical elements 314-1, 314-2, 314-3, and 314-4 may be combined within the field of view of the user.

As described above, in the electronic device 100 according to the present embodiment, the optical elements 314-1, 314-2, 314-3, and 314-4 may be mounted on the one surface of each of the display panels 400a, and 400b to emit the light toward the eyes of the user, thereby effectively implementing the function of the display in the structure in which the display panels 400a and 400b are stacked.

The electronic device 100 according to the present embodiment further includes a first adhesive layer 610 interposed between the first display panel 400a and the second display panel 400b such that the first display panel 400a and the second display panel 400b are adhered to each other, and the first adhesive layer 610 may include an optical clear resin covering an outer surface of the third optical element 314-3.

That is, as shown in FIG. 17, the first display panel 400a and the second display panel 400b may be stacked to be adhered to each other through the first adhesive layer 610.

In such a case, since the third optical element 314-3 is disposed between the first display panel 400a and the second display panel 400b, it is necessary to prevent the light emitted from the third optical element 314-3 from being blocked by the first adhesive layer 610.

Therefore, the first adhesive layer 610 may be preferably made of a liquid polymer adhesive, which is a transparent optical clear resin and can thus ensure light transmittance even when it is cured.

As described above, in the electronic device 100 according to the present embodiment, the display panels 400a and 400b may be adhered to each other through the first adhesive layer 610 including the optical clear resin, thereby ensuring light transmittance even when the display panels 400a and 400b are stacked through the adhering.

Figure 18:
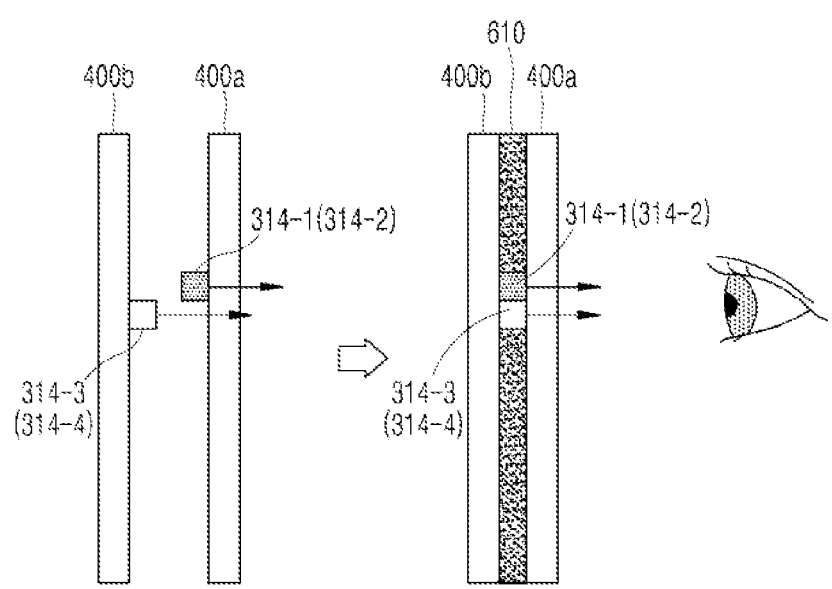
FIG. 18 is a view illustrating a second example of the state in which the display panel and the optical element are coupled to each other in the display unit of FIG. 14.

FIG. 18 is a view illustrating a second example of the state in which the display panel and the optical element are coupled to each other in the display unit of FIG. 14.

As shown in FIG. 18, in the electronic device 100 according to the present embodiment, the first optical element 314-1 and the second optical element 314-2 may be mounted on the other surface (second side) of the first display panel 400a to emit the light toward the eyes of the user, and the third optical element 314-3 may be mounted on one surface of the second display panel 400b to emit the light toward the eyes of the user.

In addition, the fourth optical element 314-4 (not shown in FIG. 18) may also be mounted on the one surface of the second display panel 400b to emit the light toward the eyes of the user.

Specifically, the substrate may be disposed on the other surface of the first display panel 400a, and the first optical element 314-1 and the second optical element 314-2 may be configured to be mounted on such substrate to emit the light toward their mounted surface.

Further, the substrate may be disposed on the one surface of the second display panel 400b, and the third optical element 314-3 and the fourth optical element 314-4 may be configured to be mounted on such substrate to emit the light toward the surface opposite to their mounted surface.

Accordingly, the certain portion of all light emitted from the first to fourth optical elements 314-1, 314-2, 314-3, and 314-4 may be combined within the field of view of the user.

As described above, in the electronic device 100 according to the present embodiment, the optical elements 314-1, 314-2, 314-3, and 314-4 may be mounted on the other surface of the first display panel 400a and on the one surface of the second display panel 400b to emit the light toward the eyes of the user, thereby effectively implementing the function of the display in the structure in which the display panels 400a and 400b are stacked.

In such a case, the first display panel 400a and the second display panel 400b may be stacked to be adhered to each other through the first adhesive layer 610 including the optical clear resin.

Figure 19:
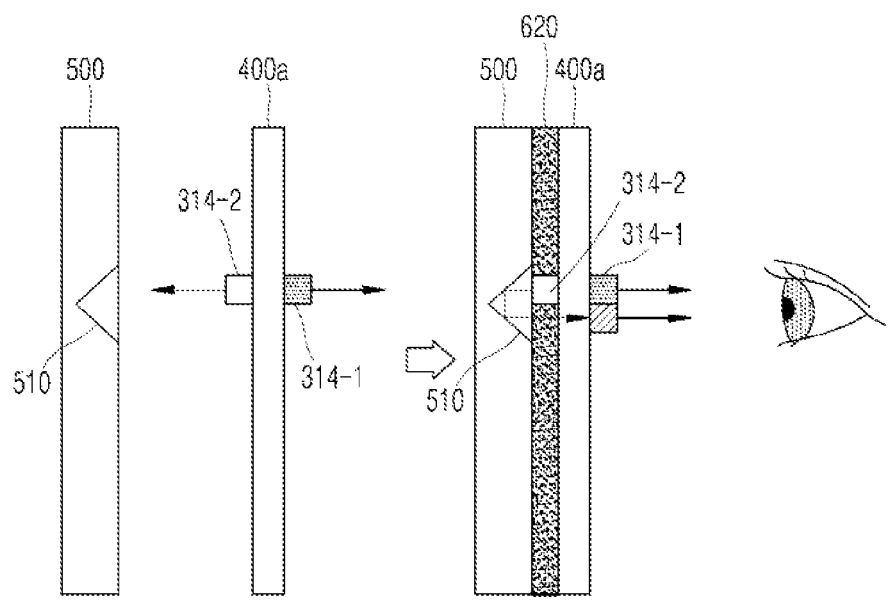
FIG. 19 is a view illustrating a third example of the state in which the display panel and the optical element are coupled to each other in the display unit of FIG. 14.

FIG. 19 is a view illustrating a third example of the state in which the display panel and the optical element are coupled to each other in the display unit of FIG. 14.

As shown in FIG. 19, the electronic device 100 according to the present embodiment further includes a guide plate 500 having one surface coupled to the other surface (second side) of the first display panel 400a so as to guide, toward the eyes of the user, the light emitted in a direction opposite to the eyes of the user. The first optical element 314-1 may be mounted on one surface (first side) of the first display panel 400a to emit the light toward the eyes of the user, and the second optical element 314-2 may be mounted on the other surface (second side) of the first display panel 400a to emit the light in a direction opposite to the eyes of the user.

In addition, the second display panel 400b may be coupled to the one surface of the first display panel 400a or coupled to the other surface of the guide plate 500 such that the second display panel 400b and the first display panel 400a are stacked to overlap each other.

Specifically, the substrates may be disposed on each of the one surface and the other surface of the first display panel 400a, and each of the first optical element 314-1 and the second optical element 314-2 may be mounted on each of these substrates.

Further, each of the first optical element 314-1 and the second optical element 314-2 mounted on each of the substrates may be configured to emit the light toward the surface opposite to their mounted surface.

Accordingly, the first optical element 314-1 emits the light toward the eyes of the user, but the second optical element 314-2 emits the light in the direction opposite to the eyes of the user. Accordingly, the light emitted from the second optical element 314-2 needs to be guided toward the eyes of the user through the guide plate 500.

Accordingly, the certain portion of all light emitted from the first to fourth optical elements 314-1, 314-2, 314-3, and 314-4 may be combined within the field of view of the user.

As described above, in the electronic device 100 according to the present embodiment, the optical elements 314-1, 314-2, 314-3, and 314-4 may be mounted on both surfaces of the display panels 400a and 400b to emit the light in both directions, and the light emitted in a direction opposite to the eyes of the user among the emitted light may be guided toward the eyes of the user through a guide plate 500 coupled to the other surfaces of the display panels 400a and 400b, thereby effectively implementing the function of the display in the structure in which the display panels 400a and 400b are stacked.

The electronic device 100 according to the present embodiment further includes a second adhesive layer 620 interposed between the first display panel 400a and the guide plate 500 such that the first display panel 400a and the guide plate 500 are adhered to each other, and the second adhesive layer 620 may include the optical clear resin covering the outer surface of the second optical element 314-2.

That is, as shown in FIG. 19, the first display panel 400a and the guide plate 500 may be stacked to be adhered to each other through the second adhesive layer 620.

In such a case, since the second optical element 314-2 is disposed between the first display panel 400a and the guide plate 500, it is necessary to prevent the light emitted from the second optical element 314-2 from being blocked by the second adhesive layer 620.

Therefore, the second adhesive layer 620 may be preferably made of the liquid polymer adhesive, which is a transparent optical clear resin and can thus ensure light transmittance even when it is cured.

As described above, in the electronic device 100 according to the present embodiment, the display panel 400a and the guide plate 500 may be adhered to each other through the second adhesive layer 620 including the optical clear resin, thereby ensuring light transmittance even when the display panel 400a and the guide plate 500 are stacked through the adhering.

In the electronic device 100 according to the present embodiment, the guide plate 500 may include a reflective element 510 for reflecting light emitted from the second optical element 314-2 to guide the light toward the eyes of the user.

In such a case, as shown in FIG. 19, the reflective element 510 includes a reflective mirror and the like, and may be installed on the guide plate 500 to reflect incident light.

Accordingly, the light that is emitted from the second optical element 314-2 and is incident on the reflective element 510 may be reflected at a predetermined angle of reflection and be guided toward the eyes of the user.

Accordingly, by variously combining the reflective elements 510 having various reflection angles, it may be possible to guide, to a desired part, the light emitted from the second optical element 314-2 disposed in all areas of the first display panel 400a.

As described above, in the electronic device 100 according to the present embodiment, the guide plate 500 may reflect light emitted in a direction opposite to the eyes of the user to guide the light toward the eyes of the user, thereby allowing the optical elements 314-1, 314-2, 314-3, and 314-4 to be disposed at more various locations on the display panels 400a and 400b.

Figure 20:
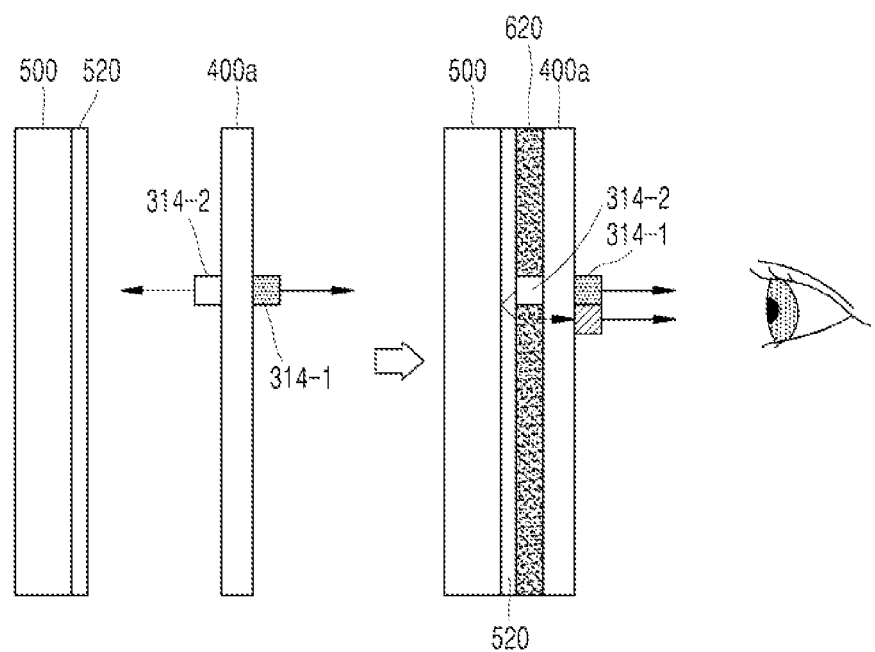
FIG. 20 is a view illustrating a fourth example of the state in which the display panel and the optical element are coupled to each other in the display unit of FIG. 14.

FIG. 20 is a view illustrating a fourth example of the state in which the display panel and the optical element are coupled to each other in the display unit of FIG. 14.

As shown in FIG. 20, in the electronic device 100 according to the present embodiment, the guide plate 500 may include a diffractive element 520 that diffracts the light emitted from the second optical element 314-2 to guide the light toward the eyes of the user.

In such a case, the diffractive element 520 includes a diffractive optical element (DOE) and/or a hologram optical element (HOE), and may be provided in such a way that a specific pattern is patterned on the surface of the guide plate 500 or a separate diffractive film is attached on the surface of the guide plate 500.

Accordingly, the light that is emitted from the second optical element 314-2 and is incident on the diffractive element 520 may be diffracted at the predetermined diffraction angle and be guided toward the eyes of the user.

Accordingly, by variously combining the diffractive element 520 having the various diffraction angles, it may be possible to guide, to a desired part, the light emitted from the second optical element 314-2 disposed in areas of the first display panel 400a.

As described above, in the electronic device 100 according to the present embodiment, the guide plate 500 may diffract the light emitted in a direction opposite to the eyes of the user to guide the light toward the eyes of the user, thereby allowing the optical elements 314-1, 314-2, 314-3, and 314-4 to be disposed at more various locations on the display panels 400a, 400b, 400c, and 400d.

Figure 21:
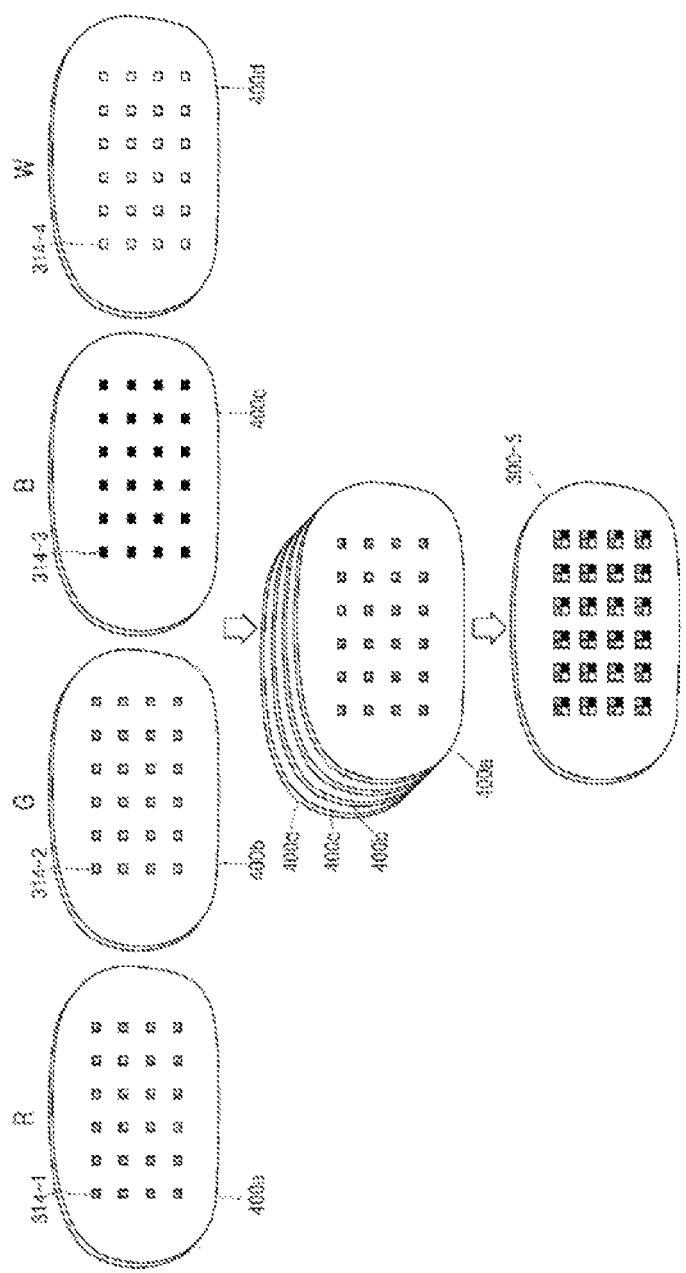
FIG. 21 is a view illustrating another example of the display unit in the electronic device of FIG. 12.

FIG. 21 is a view illustrating another example of the display unit in the electronic device of FIG. 12.

As shown in FIG. 21, the electronic device 100 according to the present embodiment includes the first display panel 400a, the second display panel 400b, the third display panel 400c, the fourth display panel 400d, the first optical element 314-1, the second optical element 314-2, the third optical element 314-3 and the fourth optical element 314-4.

The first display panel 400a has one surface (first side) facing the eyes of the user and the other surface (second side) facing a direction opposite to the eyes of the user. In addition, the first display panel 400a may be configured as the plate-shaped member such that the optical element 314-1 is disposed on at least one surface of these surfaces.

The second display panel 400b has one surface (first side) stacked on the other surface (second side) of the first display panel 400a such that the one surface of the second display panel 400b overlaps the other surface of the first display panel 400a. In addition, the second display panel 400b may be configured as the plate-shaped member such that the optical element 314-2 is disposed on at least one surface of these surfaces. Accordingly, the one surface of the second display panel 400b may be coupled to the other surface of the first display panel 400a, and the other surface of the second display panel 400b may face the direction opposite to the eyes of the user.

The third display panel 400c has one surface (first side) stacked on the other surface (second side) of the second display panel 400b such that the one surface of the third display panel 400c overlaps the other surface of the second display panel 400b. In addition, the third display panel 400c may be configured as the plate-shaped member such that the optical element 314-3 is disposed on the at least one surface of these surfaces. Accordingly, the one surface of the third display panel 400c may be coupled to the other surface of the second display panel 400b, and the other surface of the third display panel 400c may face the direction opposite to the eyes of the user.

The first optical element 314-1 may be disposed on the first display panel 400a to emit any one of the red (R) light, the green (G) light, and the blue (B) light. The first optical element 314-1 converts the image signal according to the image data to be implemented into light and then emits the converted light.

The second optical element 314-2 may be disposed on second display panel 400b to emit another one of the red (R) light, the green (G) light, and the blue (B) light, and may emit light of a different color from the first optical element 314-1.

The third optical element 314-3 may be disposed on the third display panel 400c to emit the remaining one of the red (R) light, the green (G) light, and the blue (B) light, and may emit light of a different color from the first optical element 314-1 and the second optical element 314-2.

As a result, the first to third optical elements 314-1, 314-2, and 314-3 configured to emit the red (R) light, the green (G) light, and the blue (B) light, respectively, are not all disposed on any one of the display panels 400a, 400b, and 400c, but are disposed to be dispersed on the first to third display panels 400a, 400b, and 400c, respectively.

In addition, as the first to third display panels 400a, 400b, and 400c on which the first to third optical elements 314-1, 314-2, and 314-3 are disposed to be dispersed are stacked to overlap each other, each of the mono color light emitted from the first to third optical elements 314-1, 314-2, and 314-3 may be combined such that substantially the same function as the full color panel is implemented.

As described above, in the electronic device 100 according to the present embodiment, the first to third optical elements 314-1, 314-2, and 314-3 emitting the red (R) light, the green (G) light, and the blue (B) light, respectively, may be disposed to be dispersed on the first to third display panels 400a, 400b, and 400c, respectively, thereby ensuring stable images by overcoming the restriction on the resolution (PPI) in the limited area for the display.

Further, in the electronic device 100 according to the present embodiment, the first to third display panels 400a, 400b, and 400c on which the first to third optical elements 314-1, 314-2, and 314-3 are disposed to be dispersed may be stacked to overlap one another so that the light emitted from the first to third optical elements 314-1, 314-2, and 314-3 may be combined with one another, thereby smoothly implementing the various colors despite the use of the mono color optical elements 314-1, 314-2, and 314-3.

The electronic device 100 according to the present embodiment may further include a fourth display panel 400d having one surface (a first side) stacked on the other surface (second side) of the third display panel 400c so that the one surface of the fourth display panel 400d may overlap the other surface of the third display panel 400c, and a fourth optical element 314-4 disposed on the fourth display panel 400d to emit the white (W) light.

That is, as shown in FIG. 21, the first to fourth optical elements 314-1, 314-2, 314-3, and 314-4 may be disposed on the first to fourth display panels 400a, 400b, 400c, and 400d, respectively.

When the display unit 300-5 is configured only by the first to third optical elements 314-1, 314-2, and 314-3 that emit only the red (R) light, the green (G) light, and the blue (B) light, all of the red (R) light, the green (G) light, and the blue (B) light must be emitted to express white with only these lights. Therefore, since both the durability and the efficiency of the display unit 300-5 are poor, there is a limitation in manufacturing the large-scale display unit 300-5.

Therefore, the above problem can be solved by including, in the display unit 300-5, the fourth optical element 314-4 in addition to the red (R) light, the green (G) light, and the blue (B) light because the fourth optical element 314-4 independently emits the white (W) light.

As described above, the electronic device 100 according to the present embodiment may be configured such that the fourth optical element 314-4 that emits the white (W) light is disposed on the fourth display panel 400d, and the fourth display panel 400d and the first to third display panels 400a, 400b, and 400c are stacked to overlap one another, thereby implementing a large scale display by improving the durability and the efficiency.

Meanwhile, all of the main components of the above configuration described in connection with one example of the display unit 300-5 in the electronic device 100 according to an embodiment of the present disclosure are the same as or similar to those of a configuration described in connection with another example of the display unit 300-5 in the electronic device 100 according to an embodiment of the present disclosure, except for the configuration described specifically, so detailed descriptions of the overlapping contents is omitted.

Particular embodiments or other embodiments of the present disclosure described above are not mutually exclusive to each other or distinguishable from each other. Individual structures or functions of particular embodiments or other embodiments of the present disclosure described above may be used in parallel therewith or in combination thereof.

For example, it means that structure A described with reference to a specific embodiment and/or figure and structure B described with reference to other embodiment and/or figure may be combined together. In other words, even if a combination of two different structures is not explicitly indicated, it should be understood that combination thereof is possible unless otherwise stated as impossible.

The detailed descriptions above should be regarded as being illustrative rather than restrictive in every aspect. The scope of the present disclosure should be determined by reasonable interpretation of the appended claims, and all changes within the equivalent scope of the present disclosure are included in the scope of the present disclosure.

DESCRIPTION OF SYMBOLS

| | |
|---|---|
| 100: Electronic device | 300-5: Display unit |
| 314-1: First optical element | 314-2: Second optical element |
| 314-3: Third optical element | 314-4: Fourth optical element |
| 315a: Micro LED | 314b: Transparent electrode |
| 400a: First display panel | 400b: Second display panel |
| 400c: Third display panel | 400d: Fourth display panel |
| 500: Guide plate | 510: Reflective element |
| 520: Diffractive element | 610: First adhesive layer |
| 620: Second adhesive layer | |

What is claimed is:

1. An electronic device comprising:
   a first display panel having a first side configured to face an eye of a user;
   a second display panel having a first side disposed at a second side of the first display panel such that the first side of the second display panel overlaps the second side of the first display panel;
   a first optical element disposed at the first display panel and configured to emit one of a red (R) light, a green (G) light, or a blue (B) light;
   a second optical element disposed at the first display panel together with the first optical element, wherein the second optical element is configured to emit another one of the R light, the G light, or the B light, wherein the first optical element and the second optical element emit different lights;
   a third optical element disposed at the second display panel and configured to emit a remaining one of the R light, the G light, or the B light; and
   a fourth optical element disposed at the second display panel together with the third optical element and configured to emit a white (W) light.

2. The electronic device of claim 1 wherein each of the first to fourth optical elements comprises a micro light emitting diode (LED).

3. The electronic device of claim 2, wherein each of the first to fourth optical elements further comprises a transparent electrode electrically connected to the micro LED.

4. The electronic device of claim 3, wherein illumination paths of light emitted from each of the first to fourth optical elements overlap one another.

5. The electronic device of claim 1, wherein the first optical element and the second optical element are mounted on the first side of the first display panel and configured to emit the R, G, or B lights toward the eye of the user; and
   wherein the third optical element is mounted on the first side of the second display panel, wherein the third optical element is configured to emit the remaining R, G, and B lights toward the eye of the user.

6. The electronic device of claim 5, further comprising a first adhesive layer interposed between the first display panel and the second display panel such that the first display panel and the second display panel are adhered to each other; and
   wherein the first adhesive layer comprises an optical clear resin covering a portion of the third optical element.

7. The electronic device of claim 1, wherein the first optical element and the second optical element are mounted on the second side of the first display panel and configured to emit the R, G, and B lights toward the eye of the user; and
   wherein the third optical element is mounted on the first side of the second display panel to emit the R, G, and B lights toward the eye of the user.

8. The electronic device of claim 7, further comprising a first adhesive layer interposed between the first display panel and the second display panel such that the first display panel and the second display panel are adhered to each other; and
   wherein the first adhesive layer comprises an optical clear resin covering a portion of the first to third optical elements.

9. An electronic device comprising:
   a first display panel having a first side configured to face an eye of a user;
   a second display panel having a first side disposed at a second side of the first display panel such that the first side of the second display panel overlaps the second side of the first display panel;
   a first optical element disposed at the first display panel and configured to emit one of a red (R) light, a green (G) light, or a blue (B) light;
   a second optical element disposed at the first display panel together with the first optical element, wherein the second optical element is configured to emit another one of the R light, the G light, or the B light, wherein the first optical element and the second optical element emit different lights;
   a third optical element disposed at the second display panel and configured to emit a remaining one of the R light, the G light, or the B light; and a guide plate coupled to the second side of the first display panel and configured to guide, toward the eye of the user, light emitted in a direction opposite to the eye of the user;

wherein the first optical element is mounted on the first side of the first display panel and configured to emit the light toward the eye of the user; and wherein the second optical element is mounted on the second side of the first display panel and configured to emit the light in the direction opposite to the eye of the user.

10. The electronic device of claim 9, further comprising a second adhesive layer interposed between the first display panel and the guide plate such that the first display panel and the guide plate are adhered to each other; and wherein the second adhesive layer comprises an optical clear resin covering a portion of the second optical element.

11. The electronic device of claim 10, wherein the guide plate comprises a reflective element that reflects the R, G, or B light emitted from the second optical element to guide the R, G, or B light toward the eye of the user or a diffractive element that diffracts the R, G, or B light emitted from the second optical element to guide the R, G, or B light towards the eye of the user.

12. A method, comprising:

emitting one of a red (R) light, a green (G) light, or a blue (B) light by a first optical element disposed at a first display panel, wherein the first display panel has a first side facing an eye of a user;

emitting another one of the R light, the G light, or the B light by a second optical element disposed at the first display panel together with the first optical element, wherein the first optical element and the second optical element emit different lights;

emitting a remaining one of the R light, the G light, or the B light by a third optical element disposed at a second display panel, wherein the second display panel has a first side disposed at a second side of the first display panel such that the first side of the second display panel overlaps the second side of the first display panel; and emitting a white (W) light by a fourth optical element disposed at the second display panel together with the third optical element.

* * * * *